(12) United States Patent
Wu et al.

(10) Patent No.: US 12,219,778 B2
(45) Date of Patent: Feb. 4, 2025

(54) MULTI-GATE SELECTOR SWITCHES FOR MEMORY CELLS AND METHODS OF FORMING THE SAME

(71) Applicant: Taiwan Semiconductor Manufacturing Company Limited, Hsinchu (TW)

(72) Inventors: Yong-Jie Wu, Hsinchu (TW); Yen-Chung Ho, Hsinchu (TW); Hui-Hsien Wei, Taoyuan (TW); Chia-Jung Yu, Hsinchu (TW); Pin-Cheng Hsu, Zhubei (TW); Mauricio Manfrini, Zhubei (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/230,664

(22) Filed: Apr. 14, 2021

(65) Prior Publication Data
US 2021/0408117 A1    Dec. 30, 2021

Related U.S. Application Data

(60) Provisional application No. 63/045,329, filed on Jun. 29, 2020.

(51) Int. Cl.
*H10B 61/00* (2023.01)
*H01L 21/02* (2006.01)
(Continued)

(52) U.S. Cl.
CPC ....... *H10B 61/22* (2023.02); *H01L 21/02565* (2013.01); *H01L 29/24* (2013.01);
(Continued)

(58) Field of Classification Search
CPC ... H01L 27/78645; H01L 29/24; H10B 63/30; H10B 61/22
See application file for complete search history.

(56) References Cited

U.S. PATENT DOCUMENTS 6,054,734 A * 4/2000 Aozasa ................. H01L 27/115
                                                    257/317
6,532,165 B1* 3/2003 Katori ................. H01L 29/6684
                                                    257/E21.663
(Continued)

FOREIGN PATENT DOCUMENTS

TW        201906163 A      2/2019

OTHER PUBLICATIONS

Wikimedia, "Cmos-chip_structure_in_2000s_(en)", https://commons.wikimedia.org/wiki/File:Cmos-chip_structure_in_2000s_(en).svg, Dec. 9, 2006 ("Wikimedia") (Year: 2006).*

(Continued)

*Primary Examiner* — Vincent Wall
(74) *Attorney, Agent, or Firm* — The Marbury Law Group, PLLC

(57) ABSTRACT

A memory structure includes: first and second word lines; a high-k dielectric layer disposed on the first and second word lines; a channel layer disposed on the high-k dielectric layer and comprising a semiconductor material; first and second source electrodes electrically contacting the channel layer; a first drain electrode disposed on the channel layer between the first and second source electrodes; a memory cell electrically connected to the first drain electrode; and a bit line electrically connected to the memory cell.

16 Claims, 20 Drawing Sheets

(51) Int. Cl.
    *H01L 29/24*     (2006.01)
    *H01L 29/66*     (2006.01)
    *H01L 29/786*     (2006.01)
    *H10B 53/30*     (2023.01)
    *H10B 63/00*     (2023.01)
    *H10N 50/01*     (2023.01)
    *H10N 70/00*     (2023.01)

(52) U.S. Cl.
    CPC .. *H01L 29/66969* (2013.01); *H01L 29/78645* (2013.01); *H01L 29/7869* (2013.01); *H10B 53/30* (2023.02); *H10B 63/30* (2023.02); *H10N 50/01* (2023.02); *H10N 70/063* (2023.02)

(56) References Cited

U.S. PATENT DOCUMENTS

| | | | |
|---|---|---|---|
| 6,815,772 B2* | 11/2004 | Takemura | H01L 29/41733 257/388 |
| 7,177,169 B2 | 2/2007 | Scheuerlein | |
| 7,710,759 B2* | 5/2010 | Kang | G11C 11/22 365/230.06 |
| 7,728,369 B2* | 6/2010 | Kang | H01L 29/6684 257/295 |
| 7,898,009 B2 | 3/2011 | Wilson et al. | |
| 7,932,547 B2* | 4/2011 | Kang | H01L 27/1159 257/295 |
| 8,492,828 B2 | 7/2013 | Son et al. | |
| 9,548,348 B2* | 1/2017 | Sun | H01L 21/76834 |
| 10,438,962 B2 | 10/2019 | Kim | |
| 2001/0034106 A1* | 10/2001 | Moise | H01L 21/32136 257/E21.314 |
| 2001/0044205 A1* | 11/2001 | Gilbert | H01L 21/32139 438/653 |
| 2002/0006674 A1* | 1/2002 | Ma | H01L 21/31122 257/E21.582 |
| 2005/0127428 A1* | 6/2005 | Mokhlesi | H01L 27/11521 257/E21.422 |
| 2005/0205910 A1* | 9/2005 | Kumura | H10B 53/30 257/295 |
| 2006/0115939 A1* | 6/2006 | Walker | H01L 27/1203 257/E29.151 |
| 2006/0115943 A1 | 6/2006 | Koyanagi | |
| 2007/0045688 A1* | 3/2007 | Sashida | G11C 11/22 257/295 |
| 2008/0121953 A1* | 5/2008 | Summerfelt | H01L 28/55 257/295 |
| 2008/0203443 A1* | 8/2008 | Wilson | H01L 27/1203 257/295 |
| 2009/0212363 A1* | 8/2009 | Krivokapic | H01L 29/66545 438/157 |
| 2010/0259976 A1 | 10/2010 | Abedifard | |
| 2015/0221679 A1* | 8/2015 | Yamazaki | H01L 27/1248 257/43 |
| 2016/0013309 A1* | 1/2016 | Bae | H01L 27/092 438/157 |
| 2018/0033891 A1* | 2/2018 | Pu | H01L 27/1225 |
| 2019/0273119 A1 | 9/2019 | Zhou | |
| 2019/0386139 A1* | 12/2019 | Kaya | H01L 29/423 |
| 2020/0203345 A1* | 6/2020 | Matsuzaki | H10B 99/00 |
| 2020/0287006 A1* | 9/2020 | Sharma | H01L 29/7869 |

OTHER PUBLICATIONS

Korean Patent and Trademark Office, KR Application No. 10-2021-0074857, Notice dated Jun. 7, 2022; 5 pages.
TW Patent and Trademark Office, TW Application No. 110121579, Office Action dated May 24, 2022; 5 pages.
Korean Patent and Trademark Office, KR Application No. 10-2023-0096188; Office Action dated Aug. 16, 2023; 6 pages.
Chinese Patent and Trademark Office, CN Application No. 202110728558.1, Notice dated Jun. 26, 2023; 7 pages (CN publication CN113540100A).
Korean Patent and Trademark Office, KR Application No. 10-2021-0074857, 2nd Notice of Final Rejection dated Apr. 27, 2023; 6 pages.
German Patent and Trademark Office, DE Application No. 10-2021-110427.0, 1st Examination Report dated Jun. 26, 2023; 8 pages.
Korean Patent and Trademark Office; KR Application No. 10-2023-0096188, Office Action mailed Aug. 16, 2023; 12 pages.
Korean Patent and Trademark Office; KR Application No. 10-2023-0096188, Final Office Action mailed Feb. 28, 2024; 8 pages.

* cited by examiner

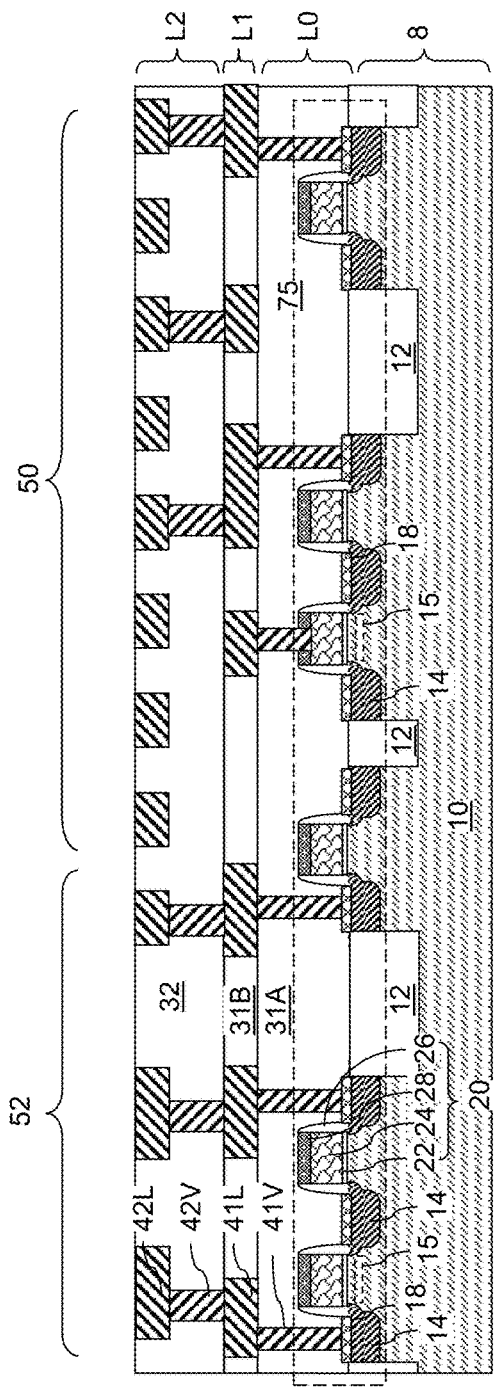
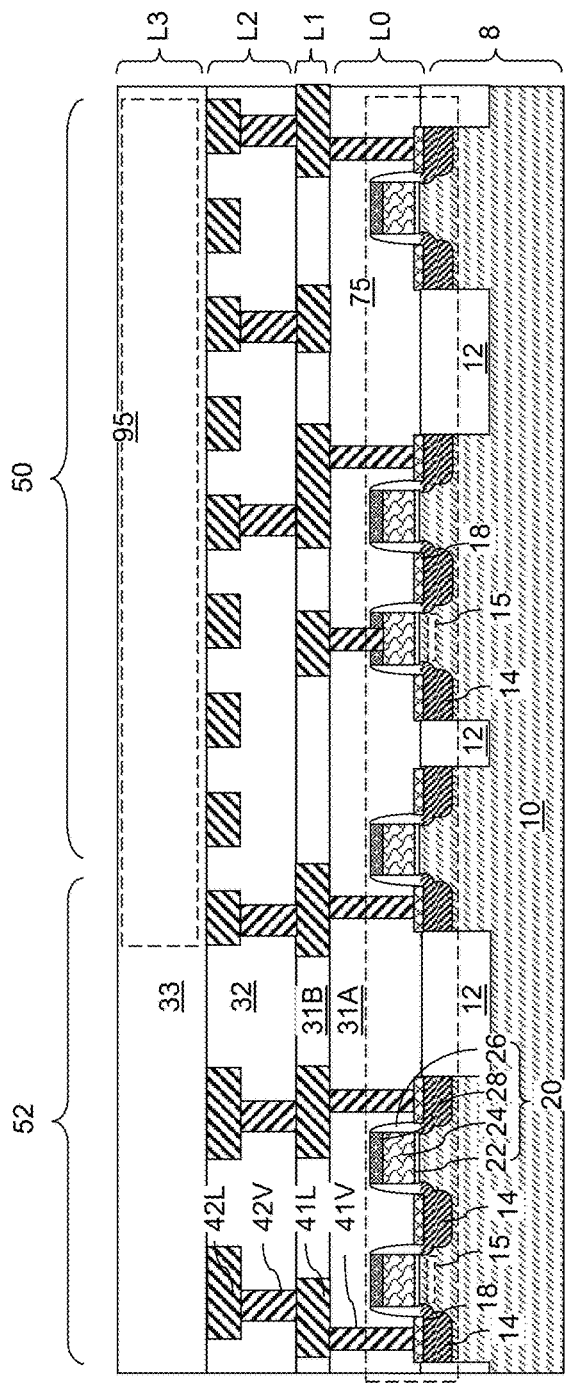
FIG. 1A
FIG. 1B

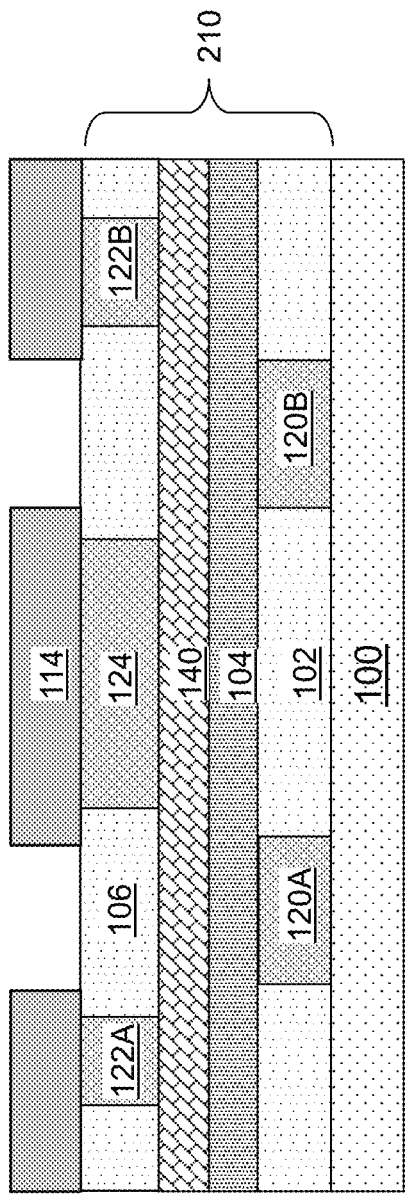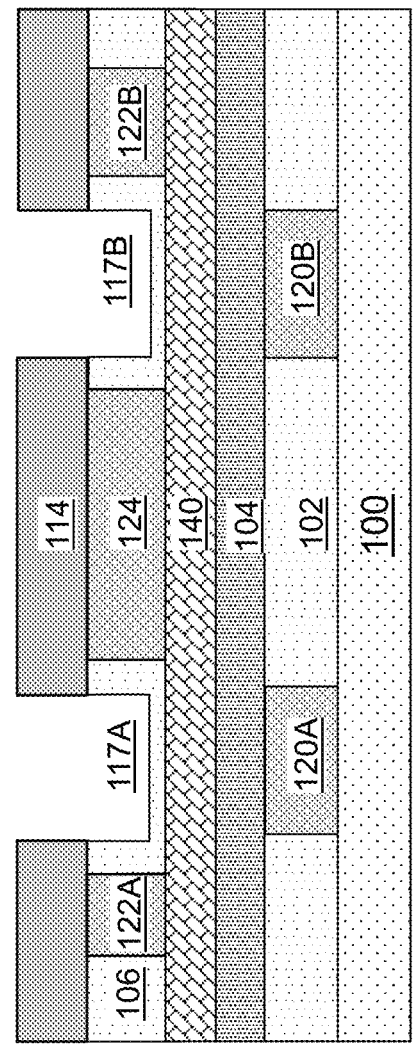
FIG. 3A
FIG. 3B

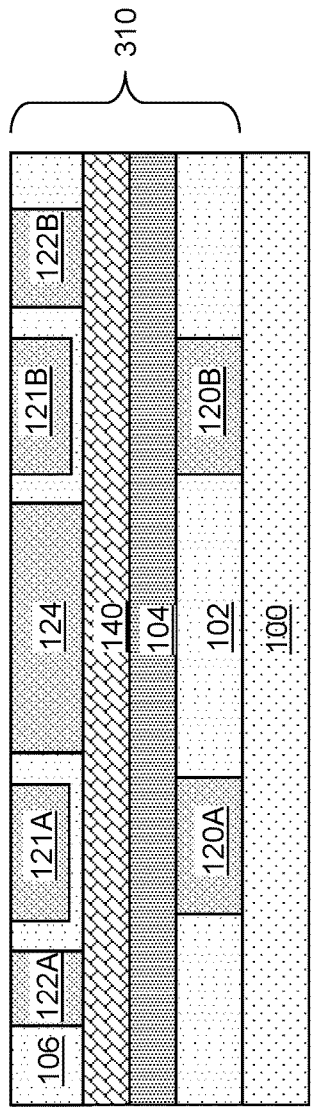
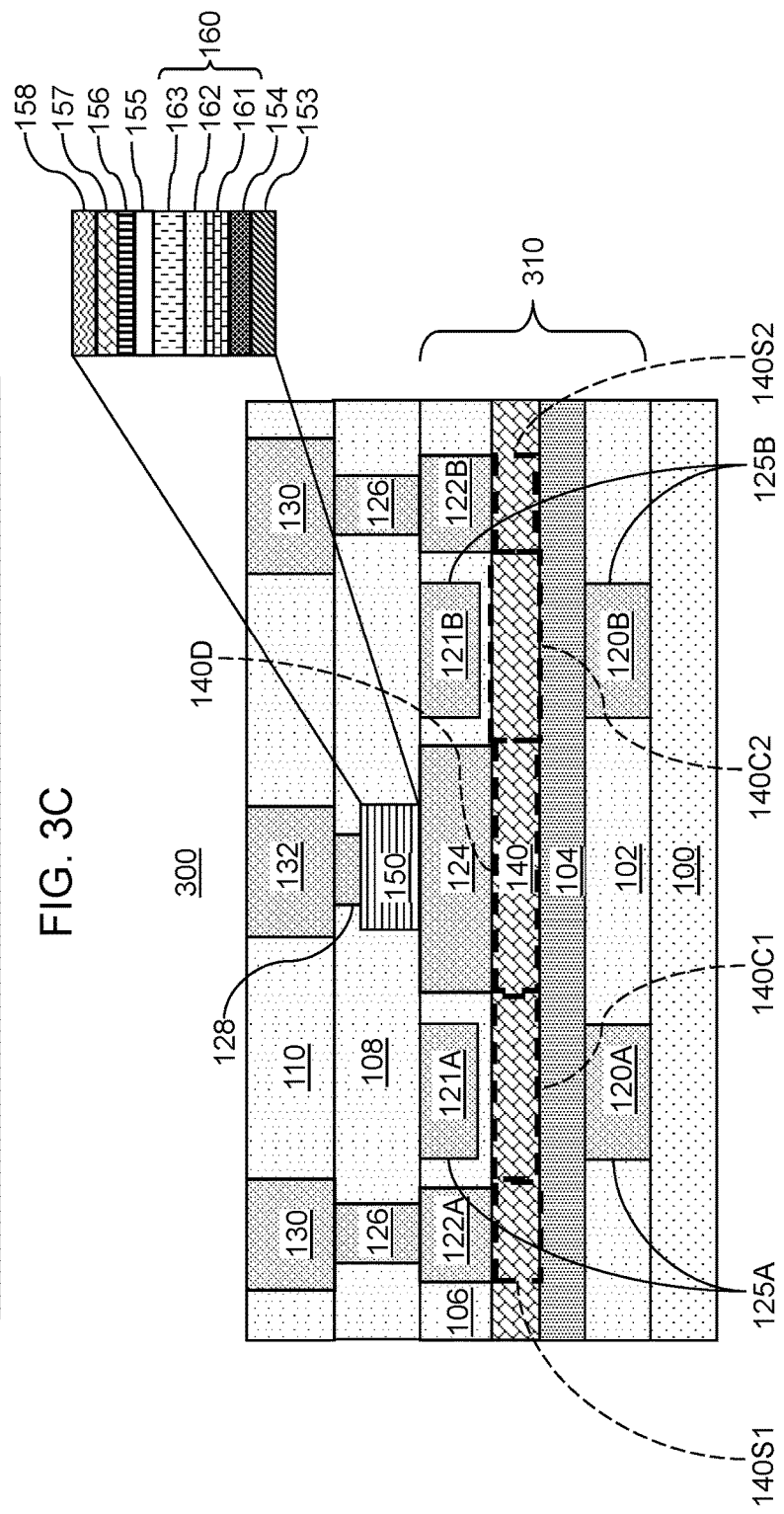
FIG. 3C
FIG. 3D

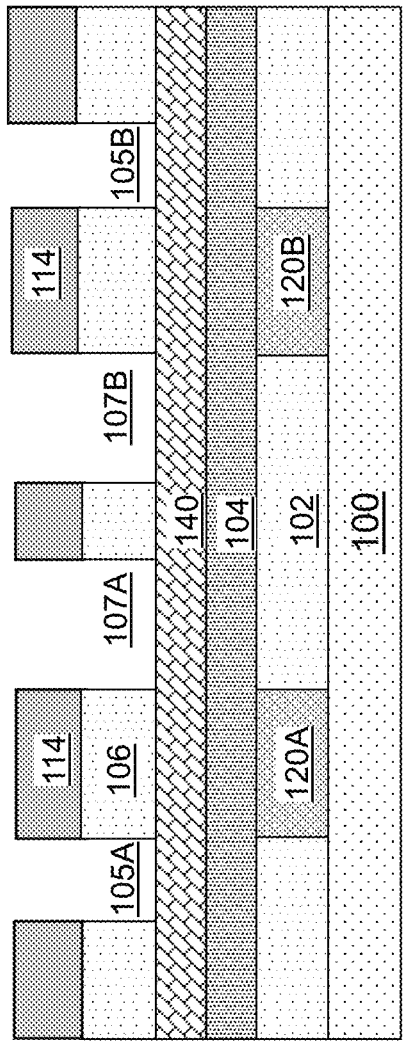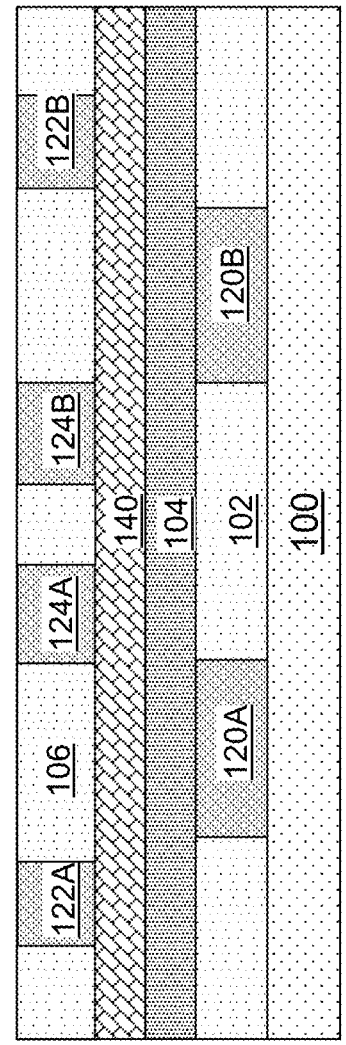
FIG. 5A
FIG. 5B

MULTI-GATE SELECTOR SWITCHES FOR MEMORY CELLS AND METHODS OF FORMING THE SAME

RELATED APPLICATIONS

This application claims priority to U.S. Provisional Patent Application No. 63/045,329 entitled "Dual-gate IGZO TFT as selector use", filed on Jun. 29, 2020, the entire contents of which are hereby incorporated by reference for all purposes.

BACKGROUND

Thin film transistors (TFTs) are considered promising candidates for back-end-of-line (BEOL) control elements in memory devices. However, metal oxide semiconductor materials utilized in TFTs may suffer from low on currents. Accordingly, there is a need for improved TFTs that provide higher on currents for improved switching of memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of an exemplary structure after formation of complementary metal-oxide-semiconductor (CMOS) transistors, metal interconnect structures embedded in dielectric material layers, and a connection-via-level dielectric material layer according to an embodiment of the present disclosure.

FIG. 1B is a vertical cross-sectional view of the first exemplary structure during formation of the array of fin back gate field effect transistors according to an embodiment of the present disclosure.

FIGS. 3A-3D are vertical cross-sectional views illustrating a succession of steps in the formation of a memory structure, according to various embodiments of the present disclosure.

FIGS. 5A-5I are vertical cross-sectional views illustrating a succession of steps in the formation of a memory structure, according to various embodiments of the present disclosure.

DETAILED DESCRIPTION

Figure 1C:
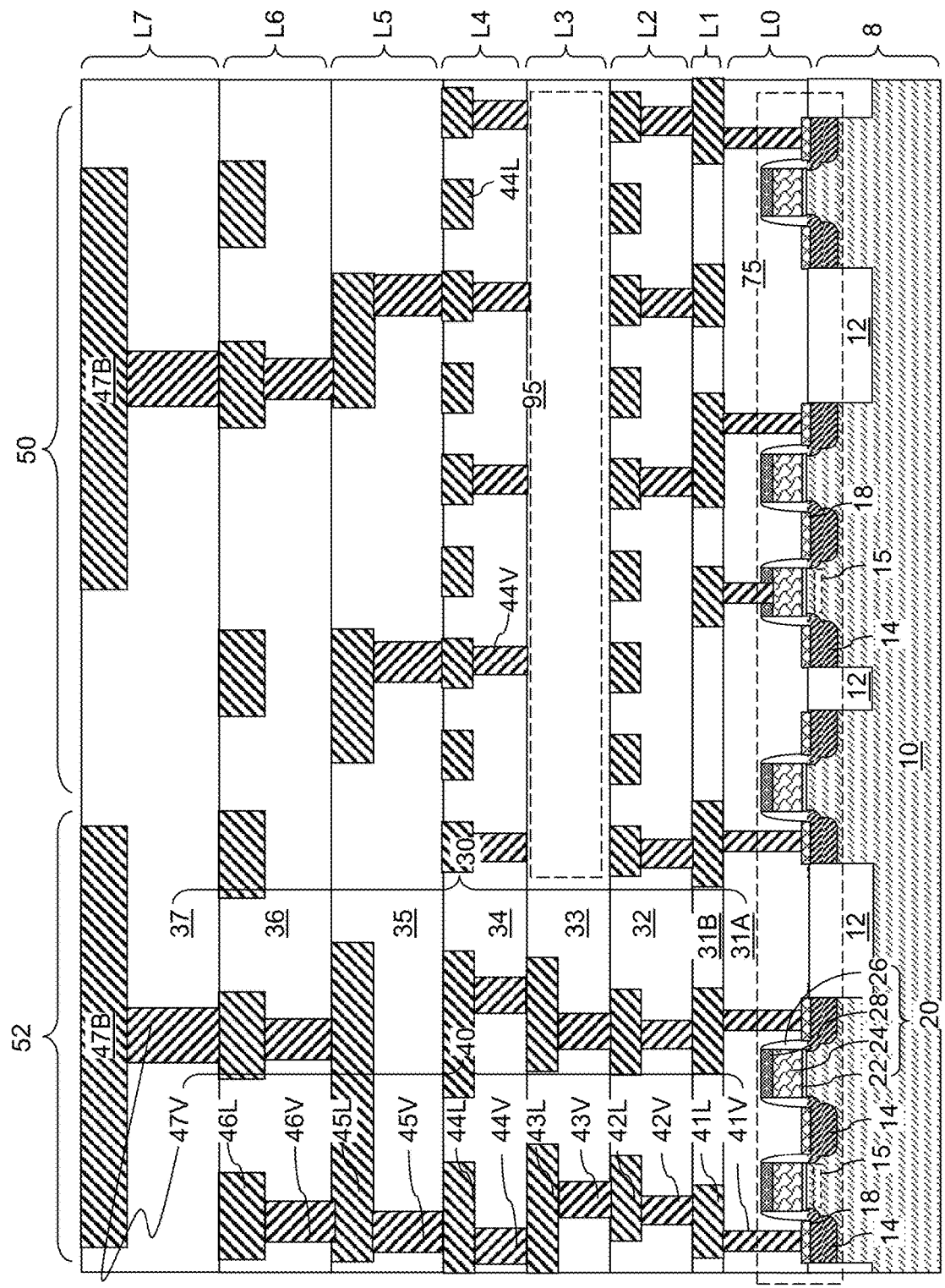
FIG. 1C is a vertical cross-sectional view of the first exemplary structure after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to a dual-gated vertical field-controlled current selector switch that may operate in conjunction with a memory cell device as a memory cell selector device. Various embodiments of the present disclosure may be directed to a gated ferroelectric memory device and methods of forming the same.

Memory devices include a grid of independently functioning memory cells formed on a substrate. Memory devices may include volatile memory cells or nonvolatile (NV) memory cells. Emerging memory technologies seek to store more data at less cost than the expensive-to-build silicon chips used by popular consumer electronics. Such emerging memory devices may be used to replace existing memory technologies such as flash memory in near future. While existing resistive random-access memories have generally been adequate for their intended purposes, as device scaling-down continues, they have not been entirely satisfactory in all respects. Emerging nonvolatile memory technologies may include resistive random-access memory (RRAM or ReRAM), magneto-resistive random-access memory (MRAM), ferroelectric random-access memory (FeRAM), and phase-change memory (PCM), for example.

RRAM is a type of NV RAM that works by changing the resistance across a dielectric solid-state material, often referred to as a memristor. MRAM is a type of NV RAM that stores data in magnetic domains. Unlike conventional RAM chip technologies, data in MRAM is not stored as electric charge or current flows, but by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. If the insulating layer is thin enough (typically a few nanometers), electrons can tunnel from one ferromagnet into the other. This configuration is known as a magnetic tunnel junction (MTJ) and is the simplest structure for an MRAM bit.

Ferroelectric RAM (FeRAM, F-RAM or FRAM) is a rando-access memory similar in construction to dynamic RAM (DRAM) but uses a ferroelectric dielectric layer instead of a dielectric material layer to achieve non-volatility. Phase-change memory (also known as PCM, PCME, PRAM, PCRAM, OUM (ovonic unified memory) and C-RAM or CRAM (chalcogenide RAM) is a type of NV RAM. PRAMs exploit the unique behavior of chalcogenide glass. In the older generation of PCM, heat produced. by the passage of an electric current through a heating element generally made of titanium nitride (TiN) was used to either quickly heat and quench the glass, making it amorphous, or to hold it in its crystallization temperature range for some time, thereby switching it to a crystalline state. PCM also has the ability o achieve a number of distinct intermediary states, thereby having the ability to hold muriple hits in a single cell. In each of these memory technologies a selecting transistor may be required to energize and select a particular memory cell to perform a read or write operation.

In some memory devices, CMOS transistors may be used as the selecting transistor. However, size limitation of the CMOS transistor technology may be the limiting factor in improving the size and memory cell density of memory devices. In order to improve the size and memory cell density that may be limited by CMOS transistors, thin film transistors (TFTs) are being adopted as promising candidates to select a memory cell. Such TFT transistors may be formed in the back-end-of-line (BEOL), which may free up valuable real estate on a substrate in the front-end-of-line (FEOL). However, metal oxide semiconductor materials utilized in TFTs may suffer from low on currents. The various embodiments described herein improve the size and memory cell density by forming gated ferroelectric memory devices in the BEOL. Various embodiments disclosed herein may provide a dual gate device, which may provide increase the on current when selecting a particular memory cell.

FIG. 1A is a vertical cross-sectional view of an exemplary structure after formation of complementary metal-oxide-semiconductor (CMOS) transistors, metal interconnect structures embedded in dielectric material layers, and a connection-via-level dielectric material layer prior to formation of an array of memory structures, according to various embodiments of the present disclosure. Referring to FIG. 1A, an exemplary structure according to an embodiment of the present disclosure is illustrated. The exemplary structure includes complementary metal-oxide-semiconductor (CMOS) transistors and metal interconnect structures formed in dielectric material layers. Specifically, the first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). Shallow trench isolation structures 12 including a dielectric material such as silicon oxide may be formed in an upper portion of the substrate 8. Suitable doped semiconductor wells, such as p-type wells and n-type wells, may be formed within each area that may be laterally enclosed by a portion of the shallow trench isolation structures 12. Field effect transistors may be formed over the top surface of the substrate 8. For example, each field effect transistor may include active source/drain regions 14, a semiconductor channel 15 that includes a surface portion of the substrate 8 extending between the active source/drain regions 14, and a gate structure 20. Each gate structure 20 may include a gate dielectric 22, a gate electrode strip 24, a gate cap dielectric 28, and a dielectric gate spacer 26. An active source/drain metal-semiconductor alloy region 18 may be formed on each active source/drain region 14. While planar field effect transistors are illustrated in the drawings, embodiments are expressly contemplated herein in which the field effect transistors may additionally or alternatively include fin field effect transistors (FinFET), gate-all-around field effect (GAA FET) transistors, or any other type of field effect transistors (FETs).

The exemplary structure may include a memory array region 50 in which an array of memory elements may be subsequently formed, and a peripheral region 52 in which logic devices that support operation of the array of memory elements may be formed. In one embodiment, devices (such as field effect transistors) in the memory array region 50 may include bottom electrode access transistors that provide access to bottom electrodes of memory cells to be subsequently formed. Top electrode access transistors that provide access to top electrodes of memory cells to be subsequently formed may be formed in the peripheral region 52 at this processing step.

Devices (such as field effect transistors) in the peripheral region 52 may provide functions that may be needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a top electrode bias circuitry. The devices formed on the top surface of the substrate 8 may include complementary metal-oxide-semiconductor (CMOS) transistors and optionally additional semiconductor devices (such as resistors, diodes, capacitors, etc.), and are collectively referred to as CMOS circuitry 75.

Various interconnect-level structures may be subsequently formed, which are formed prior to formation of an array of fin back gate field effect transistors and are herein referred to as lower interconnect-level structures (L0, L1, L2). In case a two-dimensional array of TFTs is to be subsequently formed over two levels of interconnect-level metal lines, the lower interconnect-level structures (L0, L1, L2) may include a interconnect-level structure L0, a first interconnect-level structure L1, and a second interconnect-level structure L2. The dielectric material layers may include, for example, a contact-level dielectric material layer 31A, a first metal-line-level dielectric material layer 31B, and a second line-and-via-level dielectric material layer 32. Various metal interconnect structures embedded in dielectric material layers may be subsequently formed over the substrate 8 and the devices (such as field effect transistors). The metal interconnect structures may include device contact via structures 41V formed in the contact-level dielectric material layer 31A (interconnect-level structure L0) and contact a respective component of the CMOS circuitry 75, first metal line structures 41L formed in the first metal-line-level dielectric material layer 31B (interconnect-level structure L1), first metal via structures 42V formed in a lower portion of the second line-and-via-level dielectric material layer 32, second metal line structures 42L formed in an upper portion of the second line-and-via-level dielectric material layer 32 (interconnect-level structure L2).

Each of the dielectric material layers (31A, 31B, and 32) may include a dielectric material such as an undoped silicate glass, a doped silicate glass, organosilicate glass, amorphous fluorinated carbon, porous variants thereof, or combinations thereof. Each of the metal interconnect structures (41V, 41L, 42V, and 42L) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 42V and the second metal line structures 42L may be formed as integrated line and via structures by a dual damascene process, and the second metal via structures 43V and the third metal line structures 43L may be formed as integrated line and via structures.

The dielectric material layers (31A, 31B, and 32) may be located at a lower level relative to an array of memory cells to be subsequently formed. As such, the dielectric material layers (31A, 31B, and 32) are herein referred to as lower-level dielectric material layers, i.e., dielectric material layer located at a lower level relative to the array of memory cells to be subsequently formed. The metal interconnect structures (41V, 41L, 42V, and 42L) are herein referred to lower-level metal interconnect structures. A subset of the metal interconnect structures (41V, 41L, 42V, and 42L) includes lower-level metal lines (such as the third metal line structures 42L) that are embedded in the lower-level dielectric material layers and having top surfaces within a horizontal plane including a topmost surface of the lower-level dielectric material layers. Generally, the total number of metal line levels within the lower-level dielectric material layers (31A, 31B, and 32) may be in a range from 1 to 3.

The exemplary structure may include various devices regions, which may include a memory array region 50 in which at least one array of non-volatile memory cells may be subsequently formed. For example, the at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Referring to FIG. 1B, an array 95 of non-volatile memory cells and TFT selector devices may be formed in the memory array region 50 over the second interconnect-level structure L2. The details for the structure and the processing steps for the array 95 of non-volatile gated ferroelectric memory cells are subsequently described in detail below. A third interconnect level dielectric material layer 33 may be formed during formation of the array 95 of non-volatile gated ferroelectric memory cells. The set of all structures formed at the level of the array 95 of non-volatile memory cells and gated ferroelectric memory cell devices is herein referred to as a third interconnect-level structure L3.

Referring to FIG. 1C, third interconnect-level metal interconnect structures (43V, 43L) may be formed in the third interconnect level dielectric material layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric material layer 34 having formed therein fourth interconnect-level metal interconnect structures (44V, 44L), which may include third metal via structures 44V and fourth metal lines 44L. The fifth interconnect-level structure L5 may include a fifth interconnect level dielectric material layer 35 having formed therein fifth interconnect-level metal interconnect structures (45V, 45L), which may include fourth metal via structures 45V and fifth metal lines 45L. The sixth interconnect-level structure L6 may include a sixth interconnect level dielectric material layer 36 having formed therein sixth interconnect-level metal interconnect structures (46V, 46L), which may include fifth metal via structures 46V and sixth metal lines 46L. The seventh interconnect-level structure L7 may include a seventh interconnect level dielectric material layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect level dielectric material layer may be referred to as an interconnect level dielectric (ILD) material layer 30 (i.e., 31A, 31B, 32, 33, 34, 35, 36, and 37). Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 (i.e., 41V, 41L, 42V, 42L, 43V, 43L, 44V, 44L, 45V, 45L, 46V, 46L, 47V, 47B) may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric material layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells and TFT selector devices may be formed as a component of a third interconnect-level structure L3, embodiments are expressly contemplated herein in which the array 95 of non-volatile memory cells and TFT selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and TFT selector devices may be provided within multiple interconnect-level structures in the memory array region 50. While the present disclosure is described employing an embodiment in which an array 95 of non-volatile memory cells and TFT selector devices may be formed in a single interconnect-level structure, embodiments are expressly contemplated herein in which an array 95 of non-volatile memory cells and TFT selector devices may be formed over two vertically adjoining interconnect-level structures.

Figure 2A:
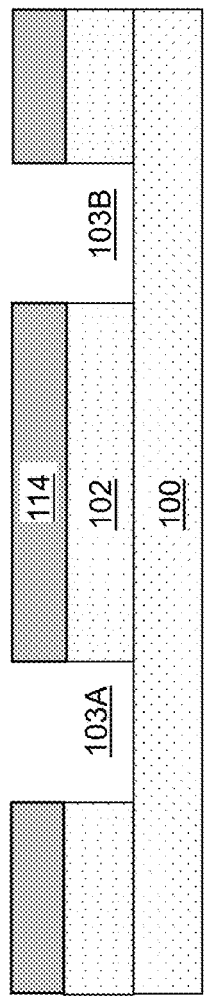
FIGS. 2A-2N are each vertical cross-sectional views illustrating a succession of steps in the formation of a memory structure, according to various embodiments of the present disclosure.
Figure 2B:
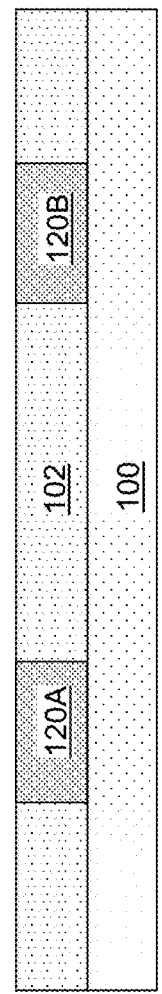
Figure 2C:
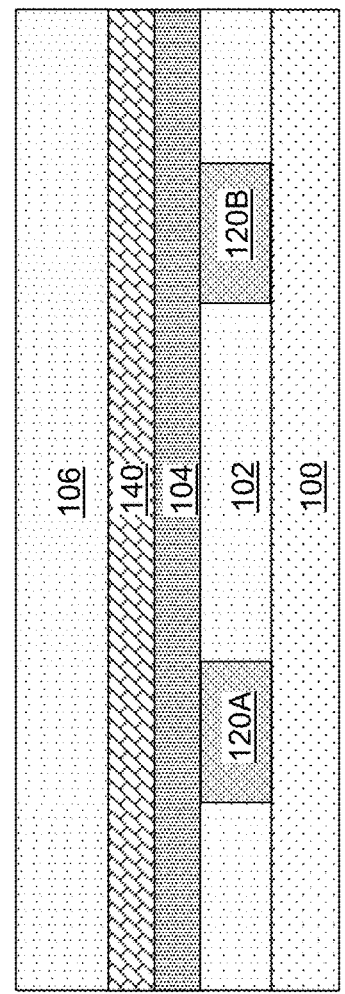
Figure 2D:
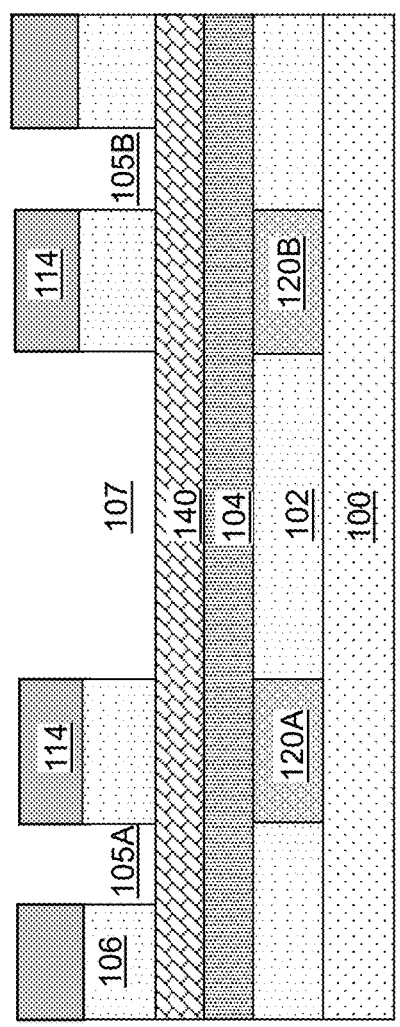
Figure 2E:
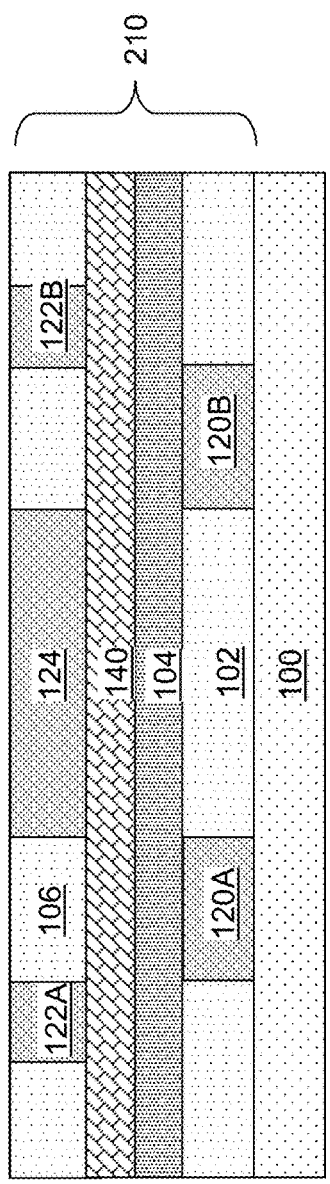
Figure 2F:
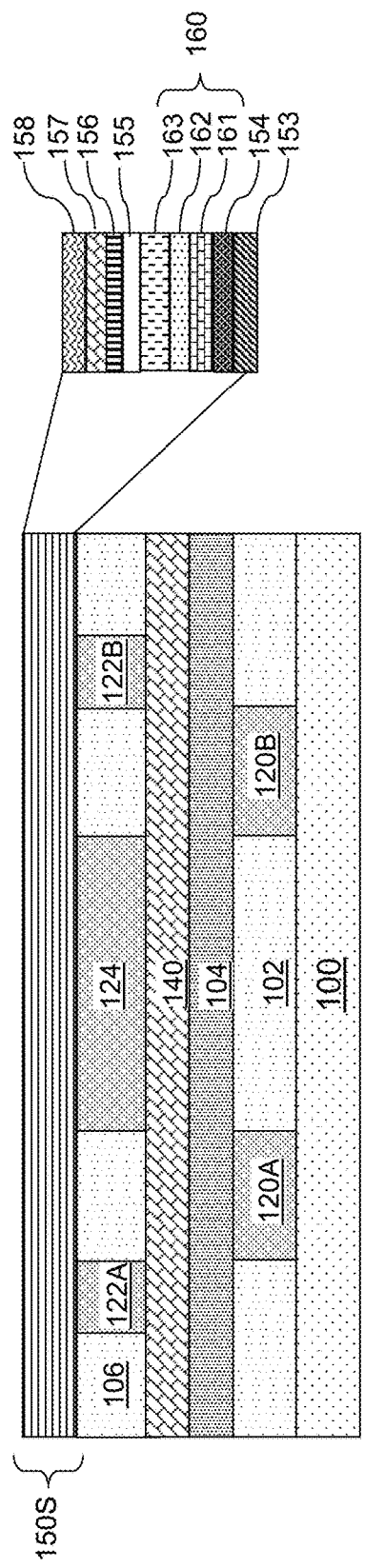
Figure 2G:
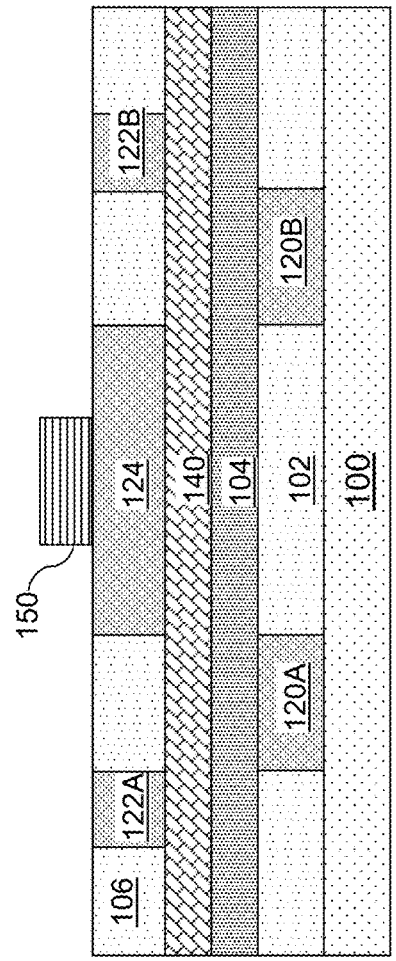
Figure 2H:
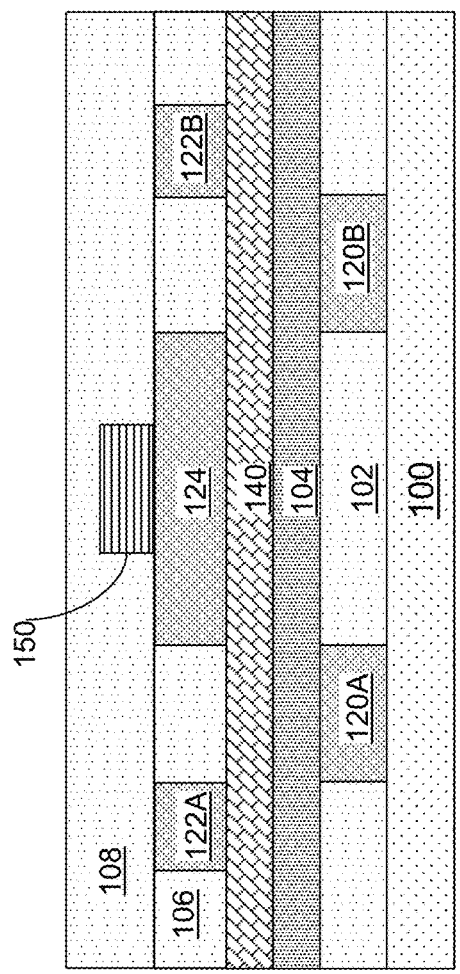
Figure 2I:
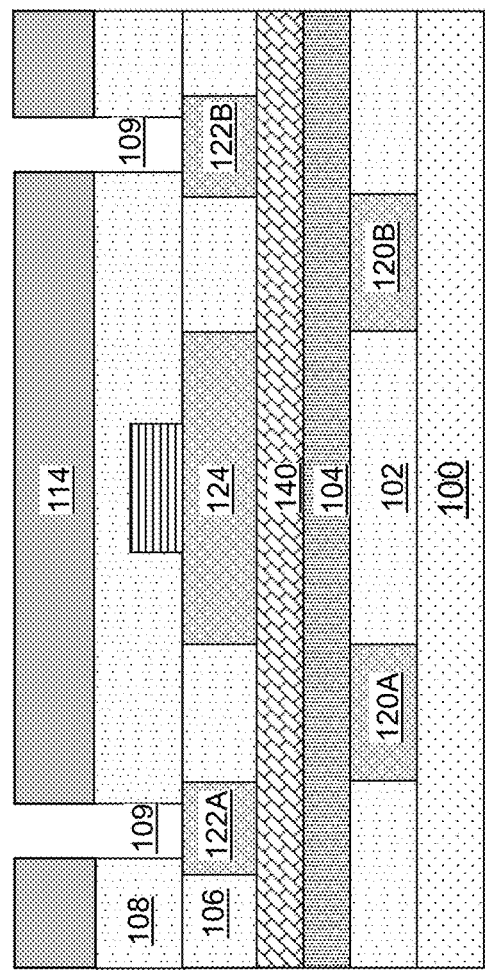
Figure 2J:
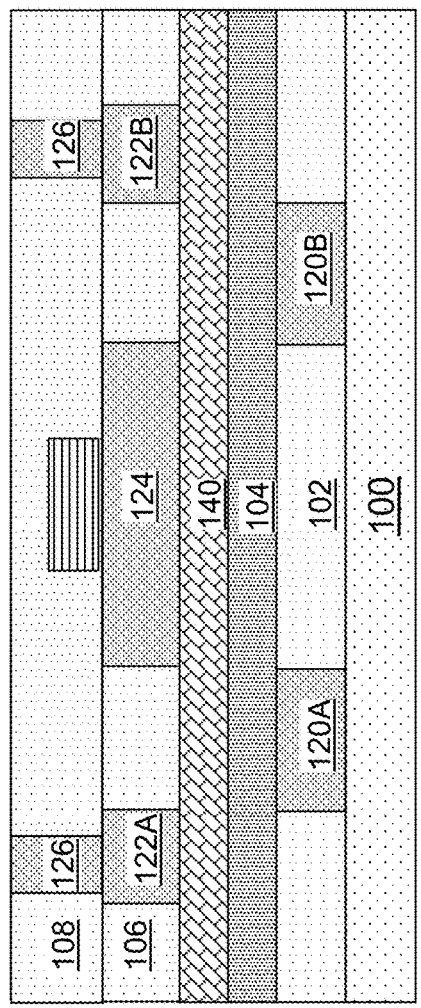
Figure 2K:
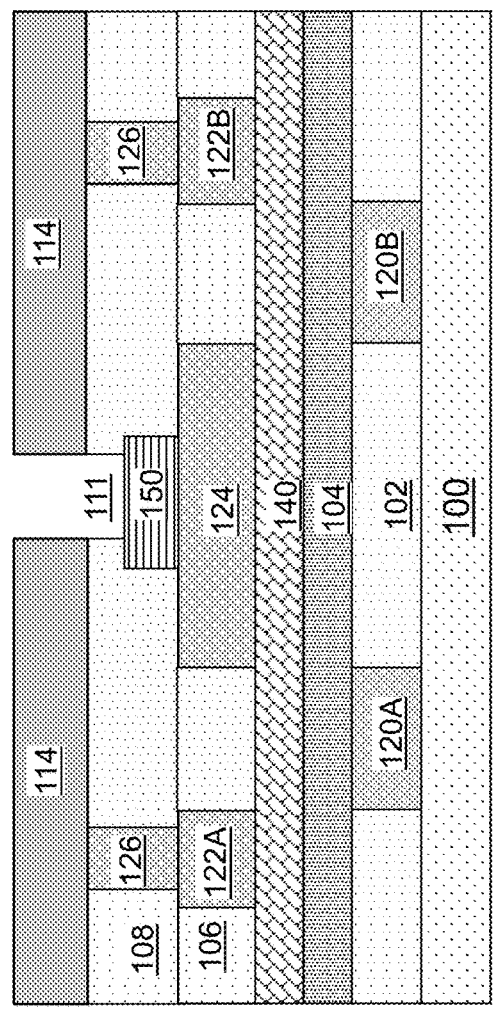
Figure 2L:
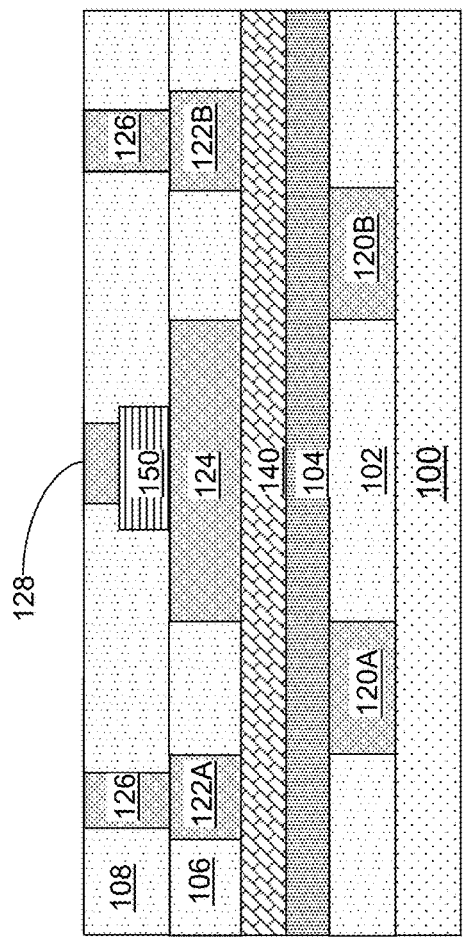
Figure 2M:
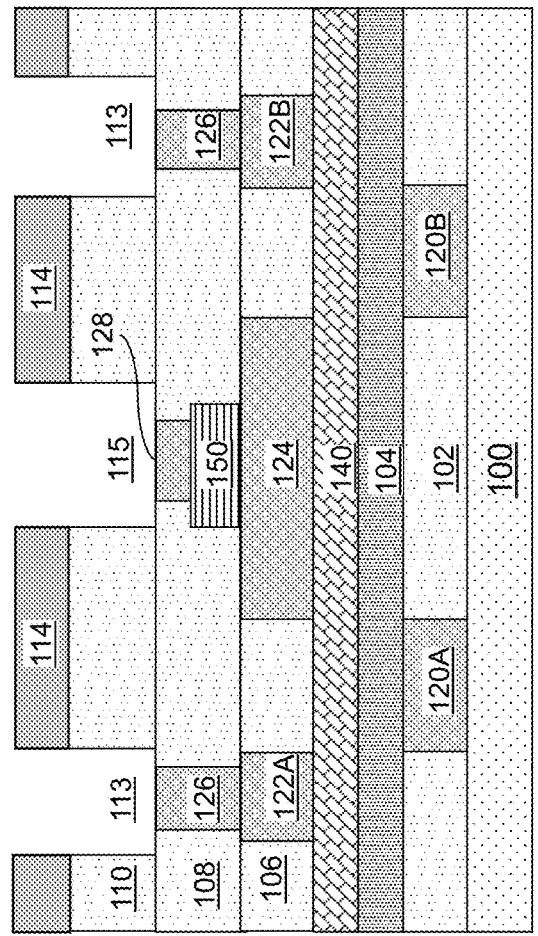
Figure 2N:
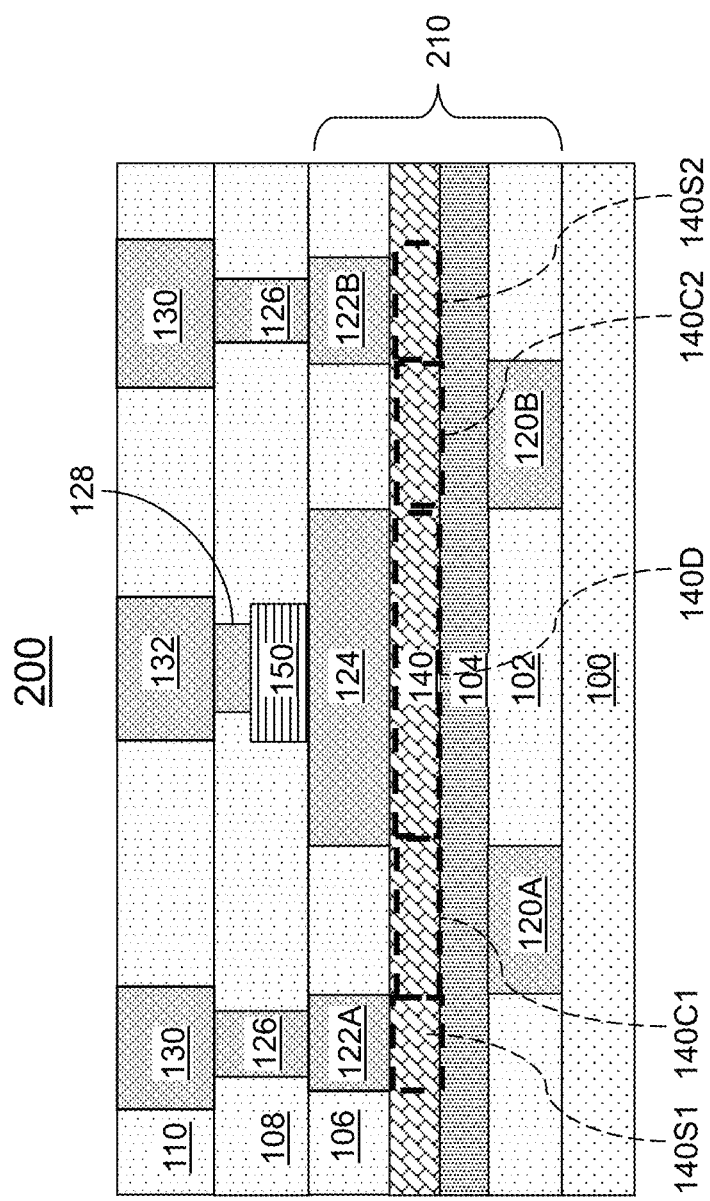

FIGS. 2A-2N are each vertical cross-sectional views showing the formation of a memory structure 200, according to various embodiments of the present disclosure. Referring to FIG. 2A, a first dielectric layer 102 may be formed on a substrate 100. The substrate 100 may be any suitable substrate, such as an amorphous silicon or polysilicon semiconductor device substrate. In other embodiments, the substrate 100 may be the third interconnect level dielectric material layer 33 as shown in FIG. 1C. The first dielectric layer 102 may be a pre-oxide layer formed on the substrate 100, such as during a thermal process. In other embodiments, the first dielectric layer 102 may include a dielectric material such as silicon oxide ($SiO_2$), undoped silicate glass, a doped silicate glass, organosilicate glass, amorphous fluorinated carbon, porous variants thereof, or combinations thereof. The first dielectric layer 102 may be deposited through any of a number of suitable deposition process or grown over an interconnect level dielectric material layer 30.

A photoresist layer 114 may be applied over the first dielectric layer 102. The photoresist layer 114 may be lithographically patterned to form a line and space pattern that includes photoresist material strips that extend along the first horizontal direction. An anisotropic etch process may be performed to etch unmasked portions of the first dielectric layer 102. Bottom gate trenches 103A and 103B extending along the first horizontal direction may be formed in areas that are not masked by the photoresist material strips. The anisotropic etch process may use any suitable etching process, such as a wet or dry etching process. The photoresist layer 114 may be subsequently removed, for example, by ashing.

Referring to FIGS. 2A and 2B, first word line 120A and second word line 120B (e.g., bottom gates) may be formed in the bottom gate trenches 103A and 103B, respectively. In particular, an electrically conductive material may be deposited on the first dielectric layer 102 and in the bottom gate trenches 103A and 103B. Herein, "suitable electrically conductive materials" may include copper, aluminum, zirconium, titanium, titanium nitride, tungsten, tantalum, tantalum nitride, ruthenium, palladium, platinum, cobalt, nickel, iridium, alloys thereof, or the like. Other suitable electrically conductive materials are within the contemplated scope of disclosure.

The electrically conductive material may be deposited using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

A planarization process, such as a chemical mechanical polishing (CMP) process or the like, may then be performed to remove excess electrically conductive metal material from the top surface of the first dielectric layer 102 and to render the top surfaces of the word lines 120A, 120B co-planar with the top surface of the first dielectric layer 102. The word lines 120A, 120B may extend parallel to one another, across the substrate 100. The word lines 120A, 120B may be spaced apart according to a desired pitch between TFT devices.

Referring to FIG. 2C, a high-k dielectric layer 104 may be deposited on the word lines 120A, 120B and the first dielectric layer 102. The high-k dielectric layer 104 may be formed by depositing any suitable high-k dielectric material, using any suitable deposition process. Herein, "suitable high-k dielectric materials" have a dielectric constant greater than 3.9 and may include, but are not limited to, silicon nitride, hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O2$) (HZO)), tantalum oxide ($Ta_2O_5$), aluminum oxide ($Al_2O_3$), hafnium dioxide-alumina ($HfO_2$—$Al_2O_3$), zirconium oxide ($ZrO_2$). Other suitable dielectric materials are within the scope of the present disclosure. In various embodiments, the high-k dielectric layer 104 may have a thickness $t_{hk}$ in the range of 0.5-5.0 nm, such as 1-4 nm, although greater or lesser thicknesses may be used.

A channel layer 140 may be deposited on the high-k dielectric layer 104. The channel layer 140 may be formed by depositing any suitable semiconductor material, using any suitable deposition process. Herein, "suitable semiconductor materials" may include polysilicon, amorphous silicon, or a semiconducting oxide, such as InGaZnO (IGZO), indium tin oxide (ITO), InWO, InZnO, InSnO, GaOx, InOx, or the like. Other suitable semiconductor materials are within the scope of the present disclosure.

A second dielectric layer 106 may be deposited on the channel layer 140. For example, the second dielectric layer 106 may be formed by depositing a dielectric material, such as silicon oxide or any suitable high-k dielectric material, using any suitable deposition method.

Referring to FIG. 2D, a photoresist layer 114 may be formed on the second dielectric layer 106. The photoresist layer 114 may be lithographically patterned in a manner as discussed above. The pattern of the photoresist layer 114 may be transferred to the second dielectric layer 106 to form source trenches 105A, 105B and a common drain trench 107. For example, the second dielectric layer 106 may be etched, using the photoresist layer 114 as a mask, using any suitable etching process.

Referring to FIGS. 2D and 2E, an electrically conductive material may be deposited on the second dielectric layer 106 and in the trenches 105A, 105B, 107, to form first source electrode 122A, second source electrode 122B in the source trenches 105A, 105B, respectively and to form a common drain electrode 124 in the drain trench 107. The electrodes 122A, 122B, 124 may be formed of any suitable electrically conductive material, using any suitable deposition process. The upper surfaces of the electrodes 122A, 122B, 124 and the second dielectric layer 106 may be planarized, for example, using a CMP process, to form a multi-gate transistor 210.

Referring to FIG. 2F, a memory stack 150S may be formed on the electrodes 122A, 122B, 124 and the second dielectric layer 106. The memory stack 150S may be formed by successively depositing different layers of a memory cell. For example, in some embodiments, the memory cell stack 150 may include a bottom electrode layer 153, a nonmagnetic metallic buffer layer 154, a synthetic antiferromagnetic layer 160, a nonmagnetic tunnel barrier layer 155, a free magnetization layer 156, a top electrode layer 157, and a metallic etch mask layer 158. The layers within the memory cell stack 150S may be deposited by a respective chemical vapor deposition process or a respective physical vapor deposition process.

Each layer within the stack 150S may be deposited as planar blanket material layers having a respective uniform thickness throughout. The nonmagnetic metallic buffer layer 154, the synthetic antiferromagnetic layer 160, the nonmagnetic tunnel barrier layer 155, and the free magnetization layer 156 are collectively referred to as memory material layers. In other words, memory material layers are formed between the bottom electrode layer 153 and the top electrode layer 157.

While the present disclosure is described using an embodiment in which the memory material layers include the nonmagnetic metallic buffer layer 154, the synthetic antiferromagnetic layer 160, the nonmagnetic tunnel barrier layer 155, and the free magnetization layer 156, the methods and structures of the present disclosure may be applied to any structure in which the memory material layers include a different layer stack provided between a bottom electrode layer 153 and a top electrode layer 157 and include material layers that may store information in any manner. Modifications of the present disclosure are expressly contemplated herein in which the memory material layers include a phase change memory material, a ferroelectric memory material, or a vacancy-modulated conductive oxide material.

The bottom electrode layer 153 includes at least one nonmagnetic metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode layer 153 may include, and/or may consist essentially of, an elemental metal such as W, Cu, Ti, Ta, Ru, Co, Mo, or Pt. The thickness of the bottom electrode layer 153 may be in a range from 10 nm to 100 nm, although lesser and greater thicknesses may also be used.

The nonmagnetic metallic buffer layer 154 includes a nonmagnetic material that may function as a seed layer. Specifically, the nonmagnetic metallic buffer layer 154 may provide a template crystalline structure that aligns polycrystalline grains of the materials of the synthetic anti-ferromagnetic layer 160 along directions that maximizes the magnetization of a reference layer within the synthetic antiferromagnetic layer 160. The nonmagnetic metallic buffer layer 154 may include Ti, a CoFeB alloy, a NiFe alloy, ruthenium, or a combination thereof. The thickness of the nonmagnetic metallic buffer layer 154 may be in a range from 3 nm to 30 nm, although lesser and greater thicknesses may also be used.

The synthetic antiferromagnetic (SAF) layer 160 may include a layer stack of a ferromagnetic hard layer 161, an antiferromagnetic coupling layer 162, and a reference magnetization layer 163. Each of the ferromagnetic hard layer 161 and the reference magnetization layer 163 may have a respective fixed magnetization direction. The antiferromagnetic coupling layer 162 provides antiferromagnetic coupling between the magnetization of the ferromagnetic hard layer 161 and the magnetization of the reference magnetization layer 163 so that the magnetization direction of the ferromagnetic hard layer 161 and the magnetization direction of the reference magnetization layer 163 remain fixed during operation of the memory cells to be subsequently formed. The ferromagnetic hard layer 161 may include a hard ferromagnetic material such as PtMn, IrMn, RhMn, FeMn, OsMn, etc.

The reference magnetization layer 163 may include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 162 may include ruthenium or iridium. The thickness of the antiferromagnetic coupling layer 162 may be selected such that the exchange interaction induced by the antiferromagnetic coupling layer 162 stabilizes the relative magnetization directions of the ferromagnetic hard layer 161 and the reference magnetization layer 163 at opposite directions, i.e., in an antiparallel alignment. In one embodiment, the net magnetization of the SAF layer 160 may be achieved by matching the magnitude of the magnetization of the ferromagnetic hard layer 161 with the magnitude of the magnetization of the reference magnetization layer 163. The thickness of the SAF layer 160 may be in a range from 5 nm to 30 nm, although lesser and greater thicknesses may also be used.

The nonmagnetic tunnel barrier layer 155 may include a tunneling barrier material, which may be an electrically insulating material having a thickness that allows electron tunneling. For example, the nonmagnetic tunnel barrier layer 155 may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the nonmagnetic tunnel barrier layer 155 may be 0.7 nm to 1.3 nm, although lesser and greater thicknesses may also be used.

The free magnetization layer 156 includes a ferromagnetic material having two stable magnetization directions that are parallel or antiparallel to the magnetization direction of the reference magnetization layer 163. The free magnetization layer 156 includes a hard ferromagnetic material such as Co, CoFe, CoFeB, CoFeTa, NiFe, CoPt, CoFeNi, etc. Other suitable materials within the contemplated scope of disclosure may also be used. The thickness of the free magnetization layer 156 may be in a range from 1 nm to 6 nm, although lesser and greater thicknesses may also be used.

The top electrode layer 157 includes a top electrode material, which may include any nonmagnetic material that may be used for the bottom electrode layer 153. Exemplary metallic materials that may be used for the top electrode layer 157 include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode layer 153 may include, and/or may consist essentially of, an elemental metal such as W, Cu, Ti, Ta, Ru, Co, Mo, or Pt. The thickness of the top electrode layer 157 may be in a range from 10 nm to 100 nm, although lesser and greater thicknesses may also be used.

The metallic etch mask layer 158 includes a metallic etch stop material that provides high resistance to an anisotropic etch process to be subsequently used to etch a dielectric material (which may include, for example, undoped silicate glass, a doped silicate glass, or organosilicate glass). In one embodiment, the metallic etch mask layer 158 may include a conductive metallic nitride material (such as TiN, TaN, or WN) or a conductive metallic carbide material (such as TiC, TaC, or WC). In one embodiment, the metallic etch mask layer 158 includes, and/or consists essentially of, TiN. The metallic etch mask layer 158 may be deposited by chemical vapor deposition or physical vapor deposition. The thickness of the metallic etch mask layer 158 may be in a range from 2 nm to 20 nm, such as from 3 nm, to 10 nm, although lesser and greater thicknesses may also be used.

Referring to FIG. 2G, the metallic etch mask 158 may be patterned to form a pattern that mask the underlying memory stack 150S. the pattern of the metallic etch mask 158 may be transferred to the underlying memory stack 150S through an anisotropic etch process to form a memory cell 150. The metallic etch mask 158 may be consumed through the anisotropic etch process that forms the memory cell 150.

Referring to FIG. 2H, a third dielectric layer 108 may be formed on the second dielectric layer 106, covering the memory cell 150 and the source electrodes 122A, 122B and the common drain electrode 124. The third dielectric layer 108 may be formed of any suitable dielectric material, using any suitable deposition process.

Referring to FIG. 2I, a patterned photoresist layer 114 may be formed on the third dielectric layer 108. The pattern from the photoresist layer 114 may be transferred to the third dielectric layer 108 to form first via channels 109 that expose the top surfaces of the source electrodes 122A, 122B. The patterning may involve any suitable etching process, such as wet or dry etching processes.

Referring to FIGS. 2J, the photoresist layer 114 may be removed, and any suitable electrically conductive material may be deposited in the first via channels 109 to form first via contacts 126. In particular, the first via contacts 126 may extend through the third dielectric layer and may electrically contact the source electrodes 122A, 122B. A planarization process, such as CMP, may be performed to planarize the upper surfaces of the first via contacts 126 and the third dielectric layer 108.

Referring to FIG. 2K, a patterned photoresist layer 114 may be formed on the third dielectric layer 108. The third dielectric layer 108 may then be patterned, using the photoresist layer PR as a mask, to form a second via channel 111. The patterning may involve any suitable etching process, such as wet or dry etching processes.

Referring to FIGS. 2K and 2L, the photoresist layer 114 may be removed, and any suitable electrically conductive material may be deposited in the second via channel 111 to form a second via contact 128. The second via contact 128 may electrically contact a top electrode of the memory cell 150. A planarization process, such as CMP, may be performed to planarize the upper surfaces of the second via contact 128 and the third dielectric layer 108.

Referring to FIG. 2M, a fourth dielectric layer 110 may be formed on the third dielectric layer 108. The fourth dielectric layer 110 may be formed of any suitable dielectric material, using any suitable deposition process.

A patterned photoresist layer 114 may be formed on the fourth dielectric layer 110. The fourth dielectric layer 110 may be etched using any suitable etching process, using the photoresist layer 114 as a mask, to form source trenches 113 that expose the first via contacts 126 and a bit trench 115 that exposes the second via contact 128.

Referring to FIGS. 2M and 2N, the photoresist layer 114 may be removed, and any suitable electrically conductive material may be deposited to form source lines 130 in the source channels 113 and a bit line 132 in the bit trench 115. The upper surfaces of the lines 130, 132 and the fourth dielectric layer 110 may be planarized, for example, using a CMP process, to complete a memory structure including a multi-gate transistor 210.

The channel layer 140 may include first and second source regions 140S1, 140S2, first and second channel regions 140C1, 140C2, and a drain region 140D. The first and second source electrodes 122A, 122B may respectively overlap with the first and second source regions 140S1, 140S2. The first and second word lines 120A, 120B may respectively overlap with the first and second channel regions 140C1, 140C2, and the drain electrode 124 may overlap with the drain region 140D.

In operation, the source lines 130 may provide a current to the source electrodes 122A, 122B, via the via contacts 126 and the underlying source regions 140S1, 140S2. The word lines 120A, 120B may operate as gates to respectively control current flow from the first and second source electrodes 122A, 122B, first and second source regions 140S1, 140S2 through the first and second channel regions 140C1, 140C2, to the common drain electrode 124, via the drain region 140D.

Current may be provided from the drain electrode 124 to a bottom electrode 153 of the memory cell 150. The bit line 132 may be electrically connected to a top electrode of the memory cell 150, via the via contact 128. Accordingly, the dual-gate structure of the transistor 210 may provide improved voltage threshold control. In addition, the transistor 210 may be configured to provide current from both of the source electrodes 122A, 122B to the drain electrode 124, via the first and second channel regions 140C1, 140C2. As such, the transistor 210 may provide twice the current to the memory cell 150, as compared to a similar transistor that only includes a single-gate and source electrode. As such, the transistor 210 may provide improved RAM switching with respect to the memory cell 150.

Figure 4:
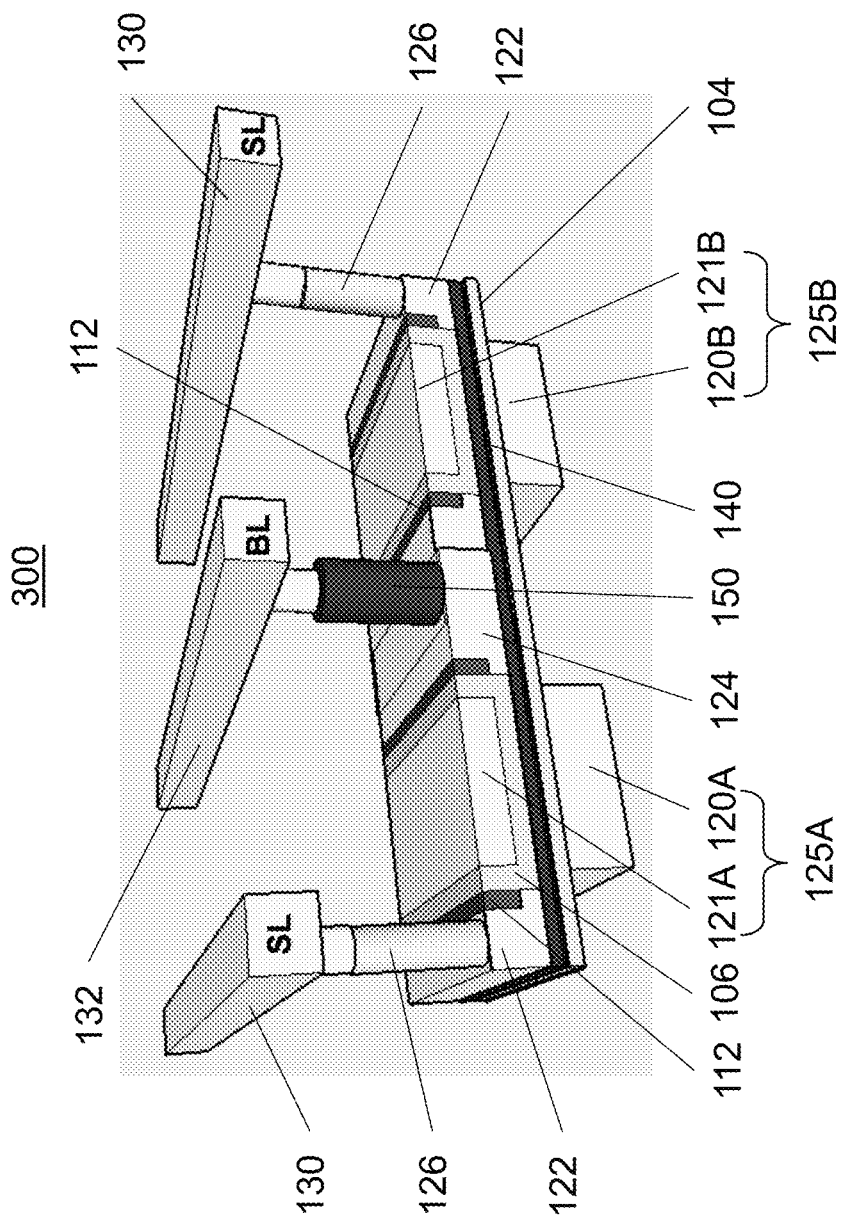
FIG. 4 is a perspective view of a memory structure of FIG. 3D.

FIGS. 3A-3D are each vertical cross-sectional views showing the formation of an alternative embodiment memory structure 300, according to other embodiments of the present disclosure. FIG. 4 is a perspective view of the memory structure 300. The memory structure 300 may be similar to, and may be formed by similar methods, as the memory structure 200. Accordingly, only the differences there between will be discussed in detail.

Referring to FIG. 3A, a patterned photoresist layer 114 may be formed on the second dielectric layer 106 of a transistor 210, which may be formed as disclosed above with respect to FIGS. 2A-2E. Further, in various embodiments, the second dielectric layer 106 may be formed of a high-k dielectric material.

Referring to FIG. 3B, the second dielectric layer 106 may be etched, using the photoresist layer 114 as a mask, to form top gate trenches 117A and 117B. The second dielectric layer 106 may be etched using any suitable etching process. After etching, the photoresist layer 114 may be removed. As shown in FIG. 3B, portions of second dielectric layer 106 may remain below top gate trenches 117A and 117B.

Referring to FIGS. 3B and 3C, any suitable electrically conductive material may be deposited to form first and second top gate electrodes 121A, 121B in the top gate trenches 117A and 117B, respectively. Upper surfaces of the top gate electrodes 121A, 121B and the second dielectric layer 106 may be planarized, for example, by using a CMP process, to complete a multi-gate transistor 310.

Referring to FIG. 3D, third dielectric layer 108 and fourth dielectric layer 110, a memory cell 150, via contacts 126, 128, source lines 130, and a bit line 132 may be formed on the transistor 310, using processes as described above with respect to FIGS. 2F-2N, to form a memory structure 300.

Referring to FIGS. 3D and 4, the first source electrode 122A and second source electrode 122B may respectively overlap with first source region 140S1 and second source region 140S2 of the channel layer 140. The top gate electrodes 121A, 121B may overlap with the word lines 120A, 120B, on opposing sides of first and second channel regions 140C1, 140C2 of the channel layer 140. Accordingly, the memory structure 300 may include first and second multi-gate structures 125A, 125B, that respectively comprise overlapped portions of the top gate electrodes 121A, 121B and the word lines 120A, 120B (e.g., bottom gate electrodes). The drain electrode 124 may overlap a common drain region 140D of the channel layer 140.

In some embodiments, the memory structure 300 may include strips of dielectric material 112 disposed between the source and drain electrodes 122A, 122B, 124 and the top gate electrodes 121A, 121B. In particular, the strips of dielectric material 112 may be configured to electrically insulate the top gate electrodes 121A, 121B from the source and drain electrodes 122A, 122B, 124.

During operation, the first multi-gate structure 125A may be configured to control current flow through the first channel region 140C1 to the drain region 140D, according to a voltage applied thereto. Similarly, the second multi-gate structure 125B may be configured to control current flow through the second channel region 140C1 to the drain region 140D, according to a voltage applied thereto. Current may flow from the drain region 140D of the channel layer, before flowing into the memory cell 150, via the drain electrode 124. Current may be output from the memory cell 150 to the bit line 132. The memory cell 150 may include a memory cell stack of materials that may be formed by successively depositing different layers of a memory cell 150. For example, in some embodiments, the memory cell stack 150 may include a bottom electrode layer 153, a nonmagnetic metallic buffer layer 154, a synthetic antiferromagnetic layer 160, a nonmagnetic tunnel barrier layer 155, a free magnetization layer 156, a top electrode layer 157, and a metallic etch mask layer 158. The layers within the memory cell 150 may be deposited by a respective chemical vapor deposition process or a respective physical vapor deposition process.

Accordingly, the multi-gate structures 125A, 125B may each provide for increased threshold voltage control, as compared to single gate structures. In addition, by providing dual multi-gate structures 125A, 125B, the drain electrode 124 may be provided with twice the current as would be provided to a similar structure including only one dual gate structure.

FIGS. 5A-5I are each vertical cross-sectional views illustrating a succession of steps in the formation of a memory structure 500, according to various other embodiments of the present disclosure. FIG. 6 is a perspective view of the memory structure 500. The memory structure 500 may be similar to, and may be formed by similar methods, as the memory structure 200. Accordingly, only the differences there between will be discussed in detail.

Referring to FIG. 5A, a patterned photoresist layer 114 may be formed on the second dielectric layer 106 of a semiconductor structure that may be formed as disclosed above with respect to FIGS. 2A-2C. In various embodiments, the second dielectric layer 106 may be formed of a high-k dielectric material. The second dielectric layer 106 may be etched to form source trenches 105A, 105B and drain trenches 107A, 107B, using any suitable etching process. The photoresist layer 114 may be removed after the etching process.

Referring to FIG. 5B, any suitable electrically conductive material may be deposited using any suitable deposition method, to form first and second source electrodes 122A, 122B in the source channels 105A, 105B, and first and second drain electrodes 124A, 124B in the drain trenches 107A, 107B. The electrically conductive material may be deposited using any suitable method. The upper surfaces of the electrodes 122A, 122B, 124A, 124B and the second dielectric layer 106 may be planarized, for example, using a CMP process.

Figure 5C:
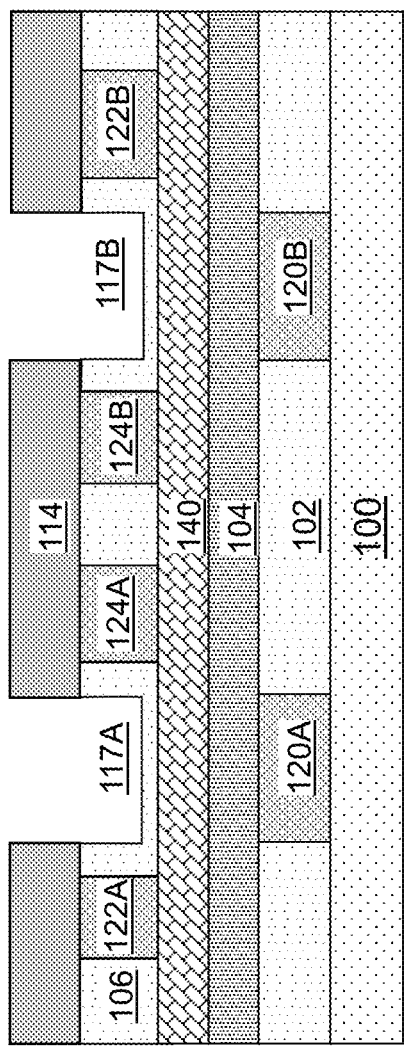
Figure 6:
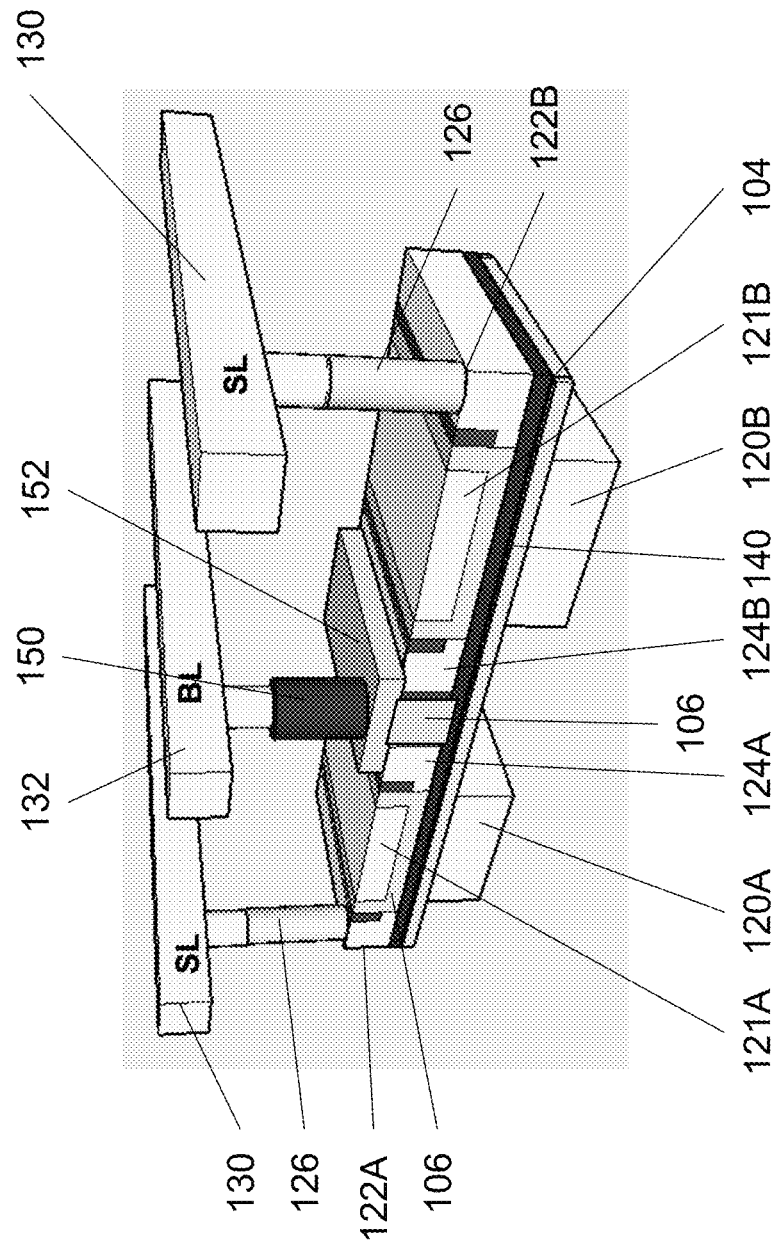
FIG. 6 is a perspective view of a memory structure of FIG. 5I.

Referring to FIG. 5C, a patterned photoresist layer PR may be formed on the second dielectric layer 106. The second dielectric layer 106 may be etched, using the photoresist layer 114 as a mask, to form top gate trenches 117A, 117B. The second dielectric layer 106 may be etched using any suitable etching process. After etching, the photoresist layer 114 may be removed. As shown in FIG. 5C, portions of second dielectric layer 106 may remain below top gate trenches 117A and 117B.

Figure 5D:
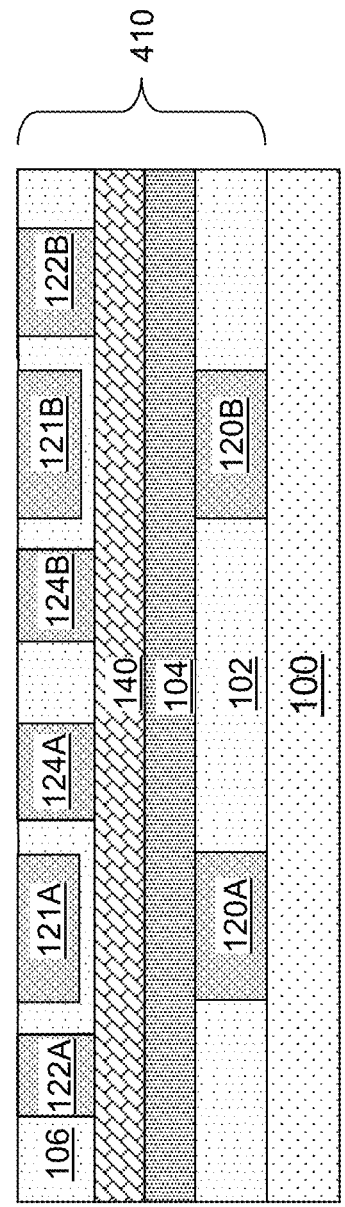

Referring to FIGS. 5C and 5D, any suitable electrically conductive material may be deposited to form first and second top gate electrodes 121A, 121B in the top gate trenches 117A, 117B. Upper surfaces of the top gate electrodes 121A, 121B and the second dielectric layer may be planarized, for example, by using a CMP process, to form a multi-gate transistor 410.

Figure 5E:
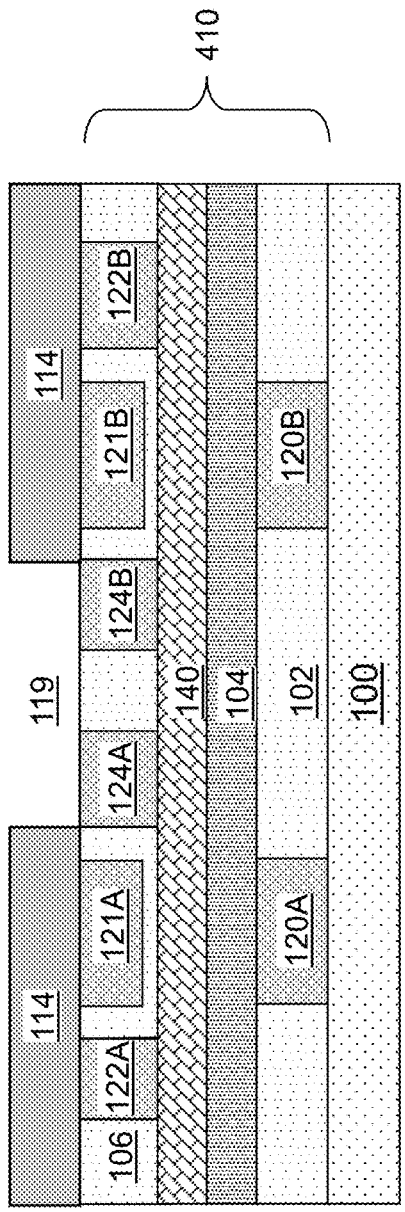

Referring to FIG. 5E, a patterned photoresist layer 114 may be formed on the transistor 410. The photoresist layer 114 may have an opening 119 that exposes the drain electrodes 124.

Figure 5F:
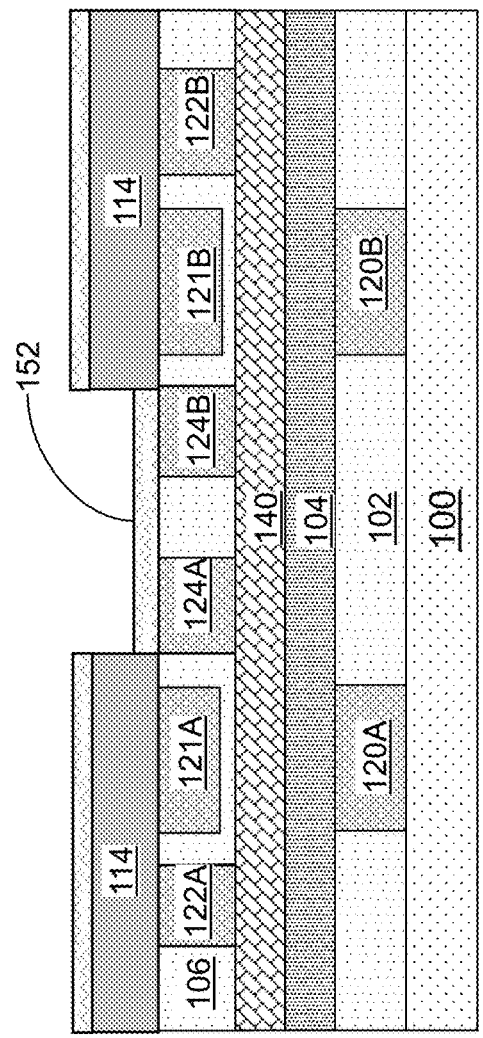

Referring to FIGS. 5E and 5F, any suitable electrically conductive material may be deposited using any suitable deposition process, to form an electrical contact 152 in the opening 119. The photoresist layer 114 may then be removed. For example, the photoresist layer 114 may be removed using a laser liftoff process, such that any of the electrically conductive material deposited thereon is removed during the removal process. The electrical contact 152 may be a metallic line or layer that electrically connects the drain electrodes 124A, 124B.

Figure 5G:
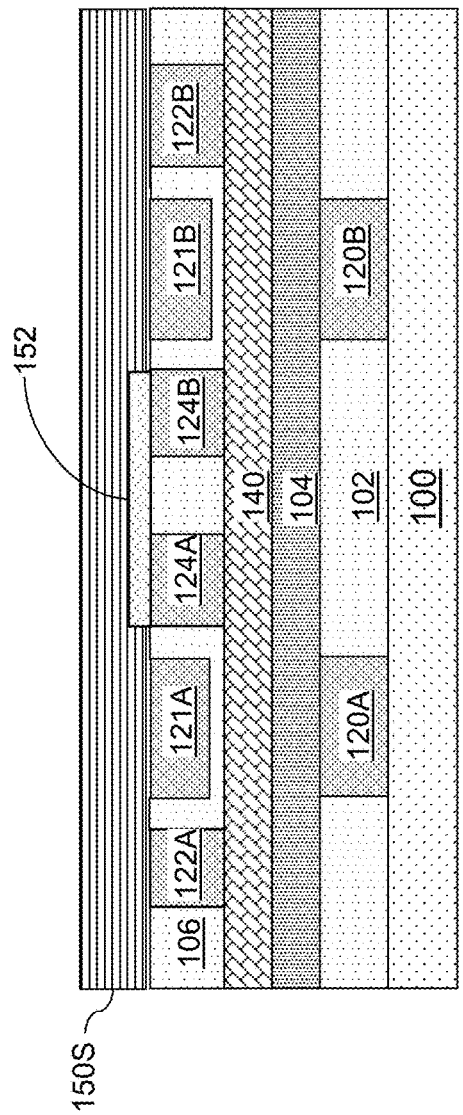

Referring to FIG. 5G, a memory stack 150S may be formed on the electrodes 122A, 122B, 124 and the second dielectric layer 106. The memory stack 150S may be formed by successively depositing different layers of a memory cell, as discussed above with respect to FIG. 2F.

Figure 5H:
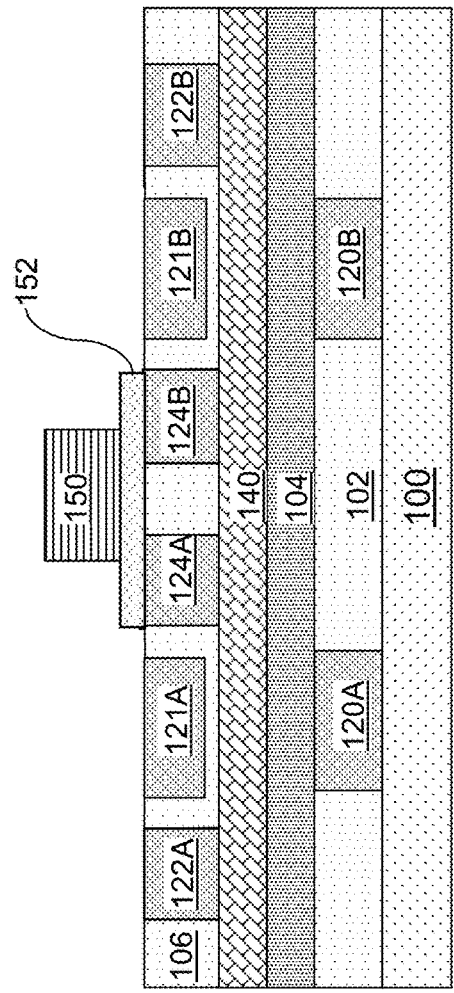

Referring to FIGS. 5G and 5H, a metallic etch mask layer 158 in the memory stack 150S may be patterned. The pattern of the metallic etch mask layer 158 may be transferred to the remaining layers of the memory stack 150S using any suitable etching process, to form a memory cell 150. In some embodiments, the memory cell 150 may be formed directly on the electrical contact 152. However, in other embodiments, the memory cell 150 may be formed directly on the drain electrodes 124A, 124B. In other words, the electrical contact 152 and the memory cell 150 may not overlap in a vertical direction, perpendicular to a plane of the channel layer Referring to FIG. 5I, third and fourth dielectric layers 108, 110, via contacts 126, 128, source lines 130, and a bit line 132 may be formed using processes as described above with respect to FIGS. 2F-2N, to form a memory structure 500.

Figure 5I:
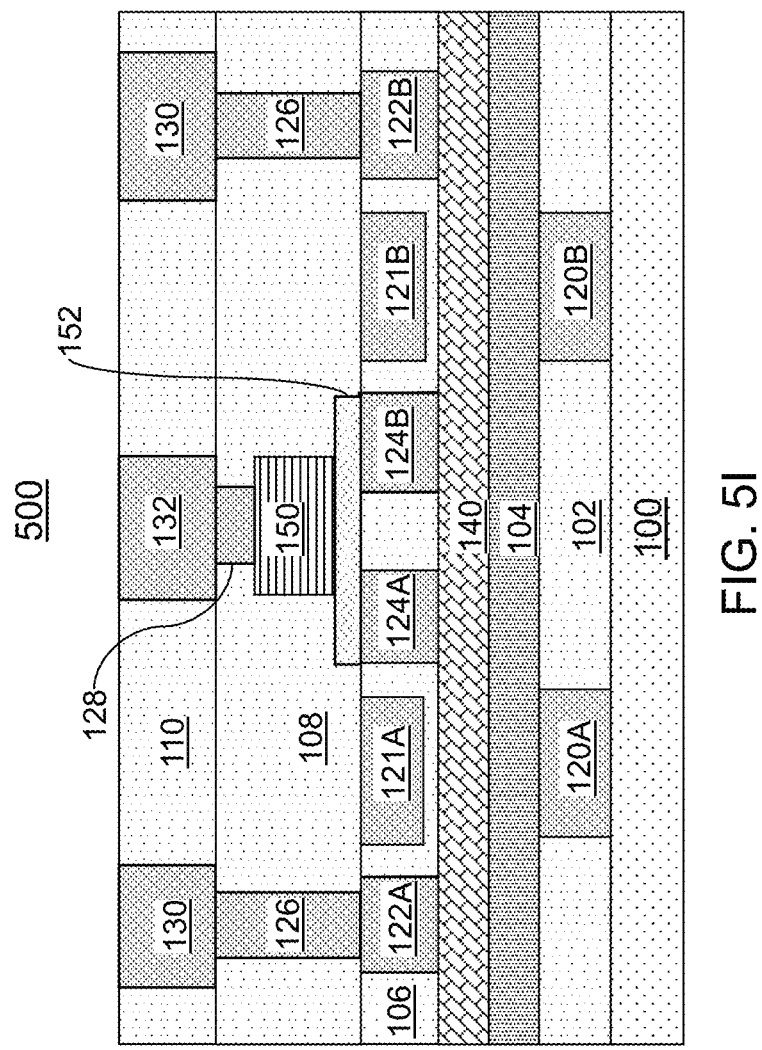

Referring to FIGS. 5I and 6, the electrical contact 152 may electrically connect the drain electrodes 124 to the memory cell 150. Accordingly, the electrical contact 152 may form a common drain that provides current from both of the drain electrodes 124 to the memory cell.

Although FIGS. 2A-6 illustrate the fabrication of memory structures 200, 300, 500 that combine an MJT memory cell 150 and a multi-gate transistor 210, 310, 410, in various embodiments the memory cell 150 may include other types of memory devices. For example, the memory cell 150 may be a metal-ferroelectric-metal capacitor, a magnetoresistive random-access memory (MRAM) cell, a resistive random-access memory (RRAM) cell, a ferroelectric random-access memory (FeRAM) cell, a phase-change random-access memory (PCRAM) cell, or a combination thereof.

Figure 7A:
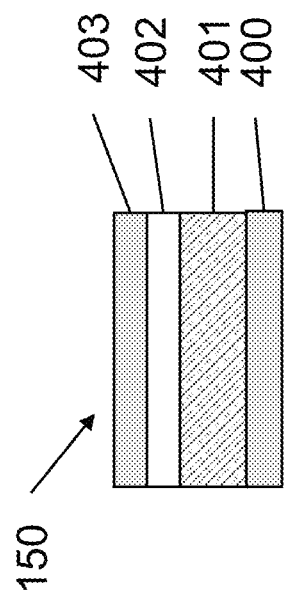
FIGS. 7A and 7B are vertical cross-sectional views of memory cells that may be included in memory structures, according to various embodiments of the present disclosure.

For example, FIG. 7A is a cross-sectional view of a memory cell 150 that may be utilized in the memory structures 300, 500, according to various embodiments of the present disclosure. Referring to FIG. 7A, in some embodiments the memory cell 150 may be a PCM memory cell including a bottom electrode 400, a top electrode 403, a heater 401, and a phase change material layer 402. The phase change material layer 402 may operate as a data storage layer.

The heater 401 may be formed of thin film of TiN, TaN, or TiAlN that has a thickness in a range from about 5 to about 15 nm to provide Joule heating to the phase change material layer 402. Also, the heater 401 may function as a heat sink during quenching (during abrupt cutoff of the current applied to the heater 401 to 'freeze' the amorphous phase).

In some embodiments, the phase change material layer 402 comprises a binary system material of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; or a quaternary system of Ag—In—Sb—Te, Ge—Sn—Sb—Te, Ge—Sb—Se—Te, Te—Ge—Sb—S, Ge—Sb—Te—O, and Ge—Sb—Te—N. In some embodiments, the phase change material layer 402 comprises a chalcogenide alloy containing one or more elements from Group VI of the periodic table, such as a GST, a Ge—Sb—Te alloy (e.g. $Ge_2Sb_2Te_5$) having a thickness of 5 to 100 nm.

The phase change material layer 402 may include other phase change resistive materials, such as metal oxides including tungsten oxide, nickel oxide, copper oxide, etc. The phase transition between the crystalline phase and the amorphous phase of the phase change material is related to the interplay between the long range order and the short range order of the structure of the phase change material. For example, collapse of the long range order generates the amorphous phase. The long range order in the crystalline phase facilitates electrical conduction, while the amorphous phase impedes electrical conduction and results in high electrical resistance. To tune the properties of the phase change material layer 402 for different needs, the phase change material layer 402 may be doped with various elements at different amounts to adjust the proportion of the short range order and the long range order inside the bonding structure of the material. The doped element may be any element used for semiconductor doping through the use of, for example, ion implantation.

Figure 7B:
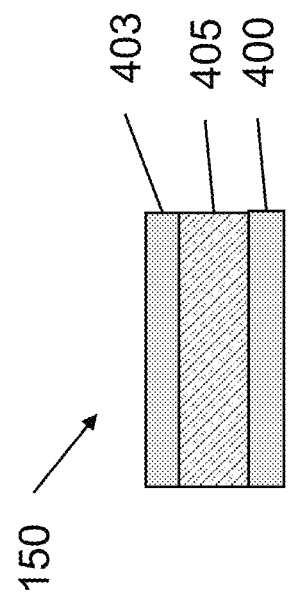

FIG. 7B is a cross-sectional view of another embodiment memory cell 150 that may be utilized in the memory structures 200, 300, 500, according to various embodiments of the present disclosure. Referring to FIG. 7B, in some embodiments the memory cell 150 may be a PCRAM memory cell including a bottom electrode 400, a top electrode 403, and a ferroelectric material layer 405, such as lead zirconate titanate (PZT) layer. The ferroelectric material layer 405 may operate as a data storage layer.

In other embodiments, the memory cell 150 may operate as a ferroelectric tunneling junction (FTJ). In particular, the ferroelectric material layer 405 may be an FE tunnel barrier. The FE tunnel barrier may be a ferroelectric film that is thin enough to allow tunneling of electrons there through. For example, the FE tunnel barrier may be about 1 nanometer (nm) to about 50 nm thick, such as from about 5 nm to about 25 nm, or about 10 nm thick.

In various embodiments, a memory device is provided that may include an array of the memory structures 200, 300, 500. In some embodiments, the memory device may include multiple arrays of the memory structures 200, 300, 500 stacked on one another over the substrate 100.

Figure 8:
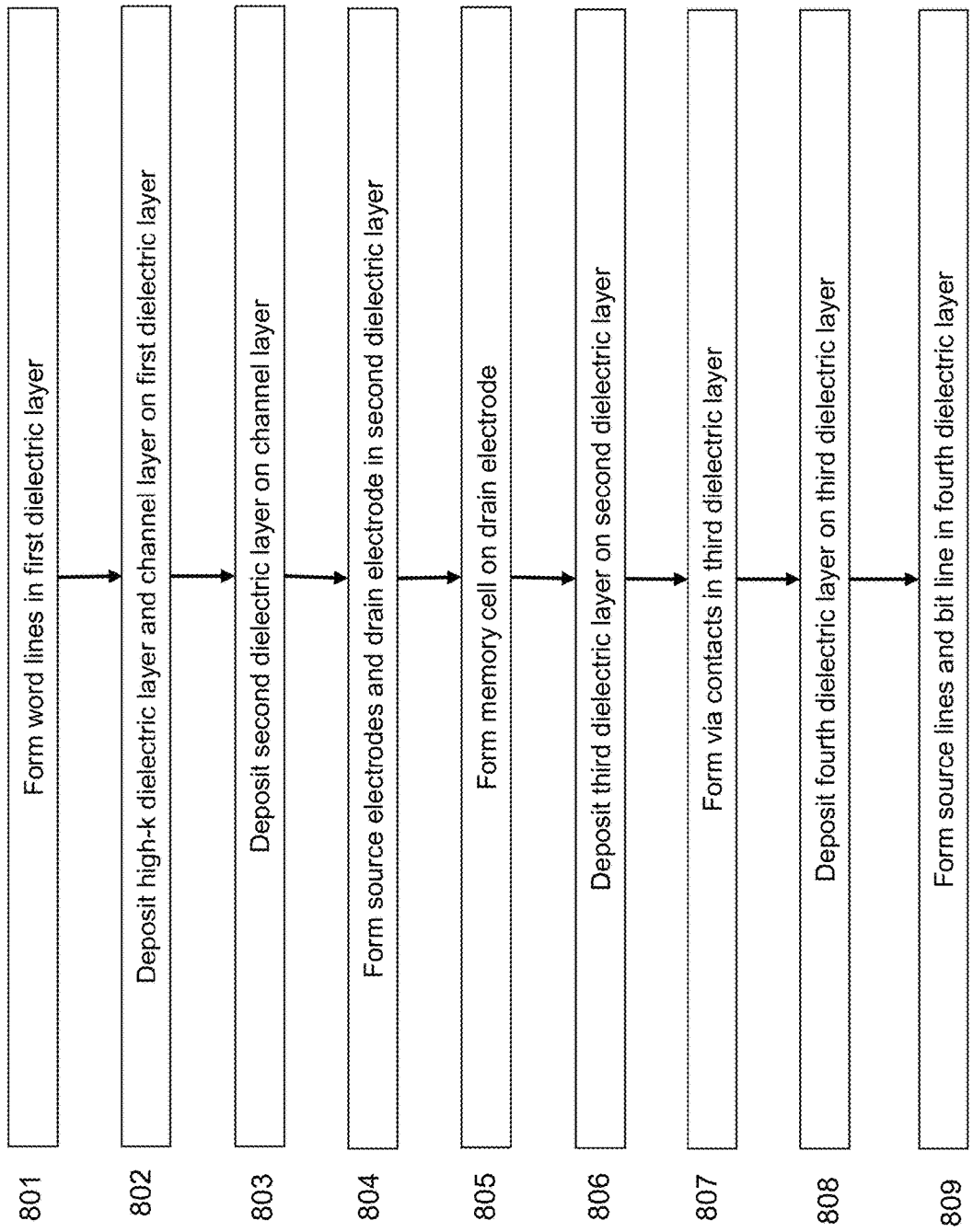
FIG. 8 is a flow chart illustrating a method of forming a memory structure, according to various embodiments of the present disclosure.

FIG. 8 is a flow diagram illustrating steps of forming a memory structure 300, 500, according to various embodiments of the present disclosure. Referring to FIGS. 8 and 2A-5I, in step 801, first and second word lines 120A, 120B may be formed in a first dielectric layer 102. For example, the word lines 120A, 120B may be formed in trenches 103A, 103B formed in the first dielectric layer 102.

In step 802, a high-k dielectric layer 104 may be deposited on the first dielectric layer 102. The high-k dielectric layer 104 may cover the word lines 120A, 120B. A channel layer 140 may then be deposited on the high-k dielectric layer 104.

In step 803 a second dielectric layer 106 may be deposited on the channel layer 140. In step 804, source electrodes 122A, 122B and one or two drain electrodes 124 may be formed in the second dielectric layer 106. In particular, the electrodes 122A, 122B, 124 may be formed in trenches 105A, 105B, 107A, and 107B formed in the second dielectric layer 106. If two drain electrodes 124 are formed, step 805 may include forming an electrical contact 152 that electrically connects the drain electrodes 124.

In step 805, a memory cell 150 may be formed on the drain electrode 124 or electrical contact 152. The memory cell 150 may include an FTJ cell, an MRAM cell, a RRAM cell, an FeRAM cell, a PCRAM cell, or the like.

In step 806, a third dielectric layer 108 may be deposited on the second dielectric layer 106. In particular, the third dielectric layer 108 may cover the memory cell 150.

In step 807, via contacts 126, 128 may be formed in the third dielectric layer 108. In particular, the via contacts 126, 128 may be formed in via channels 109, 111 formed in the third dielectric layer 108.

In step 808, a fourth dielectric layer 110 may be deposited on the third dielectric layer 108. The fourth dielectric layer 110 may cover the via contacts 126, 128.

In step 809, source lines 130 and a bit line 132 may be formed in the fourth dielectric layer 110. For example, the source lines 130 may be formed in source channels 113 and the bit line 132 may be formed in a bit trench 115 formed in the fourth dielectric layer 110.

In various embodiments, provided is a memory structure including a memory cell 150 connected to a drain electrode 124 of a transistor 210, 310, 410. The transistor 210, 310, 410 may include a channel layer 140 including a common drain region 140D disposed between first and second channel regions 140C1, 140C2. The transistor 210, 310, 410 may include gate electrodes (120A, 120B, 121A, 121B) that control current flow through the channel regions 140C1, 140C2 to the common drain region 140D. Accordingly, the memory structure may provide improved threshold voltage control and a higher current flow to the memory cell 150.

Various embodiments provide a memory structure comprising: a first word line 120A; a second word line 120B; a high-k dielectric layer 104 disposed on the first word line 120A and the second word line 120B; a channel layer 140 disposed on the high-k dielectric 104 layer and comprising a semiconductor material; a first source electrode 122A and a second source electrode 122B electrically contacting the channel layer; a first drain electrode 124 disposed on the channel layer 140 between the first source electrode 122A and the second source electrode 122B; a memory cell 150 electrically connected to the first drain electrode 124; and a bit line 132 electrically connected to the memory cell 150.

Various embodiments provide a memory structure comprising: a first word line 120A; a second word line 120B; a high-k dielectric layer 104 disposed on the first word line 120A and the second word line 120B; a channel layer 140 disposed on the high-k dielectric layer 104 and comprising a semiconductor material; a first source electrode 122A and a second source electrode 122B electrically contacting the channel layer 140; a first top gate electrode 121A overlapping with a first channel region 140C1 of the channel layer and the first word line 120A; a second top gate electrode 121B overlapping with a second channel region 140C2 of the channel layer 140 and the second word line 120B; a first drain electrode 124 disposed between the first source electrode 122A and the second source electrode 122B and electrically contacting a drain region 140D of the channel layer 140; a memory cell 150 electrically connected to the first drain electrode 124; and a bit line 132 electrically connected to the memory cell 150.

Various embodiments provide a method of forming a memory structure, comprising: forming first and second word lines 120A, 120B on a substrate; depositing a high-k layer 104 on the first and second words lines 120A, 120B; depositing a channel layer 140 comprising a semiconductor material on the high-k layer 104; forming first and second source electrodes 122A, 122B that respectively electrically contact first source regions 140S1 and a second source region 140S2 of the channel layer 140; forming a first drain electrode 124 that electrically contacts a drain region 140D of the channel layer 140 that is disposed between the first source regions 140S1 and the second source region 140S2; forming a first top gate electrode 121A and a second top gate electrode 121B that respectively overlap with the first word line 120A and the second word line 120B and first channel region 140C1 and second channel region 140C2 of the channel layer 140; and forming a memory cell 150 that electrically contacts the first drain electrode 124.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure comprising:
a semiconductor substrate comprising transistors;
a first word line comprising a first top gate electrode and a first bottom gate electrode that are electrically connected and disposed on of the semiconductor substrate;
a second word line comprising a second top gate electrode and a second bottom gate electrode and that are electrically connected and disposed on the semiconductor substrate;
a high-k dielectric layer disposed on the semiconductor substrate, the first bottom gate electrode, and the second bottom gate electrode;
a channel layer disposed on the high-k dielectric layer and under the first top gate electrode and the second top gate electrode, the channel layer comprising an oxide semiconductor thin film transistor material and a drain region that directly contacts the high-k dielectric layer;
a first source electrode and a second source electrode, wherein each of the first source electrode and the second source electrode electrically contacts the channel layer;
a first drain electrode disposed on the drain region of the channel layer, between the first source electrode and the second source electrode;
a memory cell comprising a top electrode and a bottom electrode, wherein a bottom surface of the bottom electrode directly contacts a top surface of the first drain electrode and is coplanar with top surfaces of the first top gate electrode and the second top gate electrode; and
a bit line electrically connected to the top electrode of the memory cell,
wherein the top surface of the first drain electrode is larger than the bottom surface of the bottom electrode,
wherein the first word line, the first source electrode, the first drain electrode, and a first portion of the channel layer form a first thin film transistor (TFT), and the second word line, the second source electrode, the first drain electrode, and a second portion of the channel layer form a second TFT, and
wherein the first TFT and the second TFT are respectively configured to selectively control current flow from the first source electrode and the second source electrode to the memory cell, such that current is simultaneously provided from both the first TFT and the second TFT to the memory cell when selecting the memory cell.

2. The memory structure of claim 1, wherein:
the first word line overlaps with a first channel region of the channel layer;
the second word line overlaps with a second channel region of the channel layer; and
the first drain electrode electrically contacts a drain region of the channel layer that is disposed between the first channel region and the second channel region.

3. The memory structure of claim 1, wherein the oxide semiconductor thin film transistor material is selected from indium oxide, gallium oxide, indium tin oxide, indium zinc oxide, indium tungsten oxide, or indium gallium zinc oxide.

4. The memory structure of claim 1, wherein the memory cell comprises a magnetic tunnel junction (MTJ) memory cell, a magnetoresistive random-access memory (MRAM) cell, a resistive random-access memory (RRAM) cell, a ferroelectric random-access memory (FeRAM) cell, or a phase-change random-access memory (PCRAM) cell.

5. The memory structure of claim 1, wherein:
the first bottom gate electrode and the second bottom gate electrode are embedded in a first dielectric layer disposed under the high-k dielectric layer;
the first source electrode, the second source electrode, the first top gate electrode, the second top gate electrode, and the first drain electrode are embedded in a second dielectric layer disposed over the channel layer;
the memory cell is embedded in a third dielectric layer disposed over the second dielectric layer; and
a first source line, a second source line, and the bit line are embedded in a fourth dielectric layer disposed on the third dielectric layer.

6. The memory structure of claim 5, further comprising via connections that extend through the third dielectric layer and electrically connect the first source electrode to the first source line, the second source electrode to the second source line, and the memory cell to the bit line.

7. The memory structure of claim 1, wherein the first top gate electrode and the second top gate electrode are electrically insulated from the channel layer, the first source electrode, the second source electrode, and the first drain electrode by a dielectric layer.

8. The memory structure of claim 7, wherein the dielectric layer comprises a high-k dielectric material.

9. The memory structure of claim 1, wherein the memory cell comprises:
a heater and a phase change layer disposed between the top electrode and the bottom electrode; or
a synthetic antiferromagnetic layer disposed between the top electrode and the bottom electrode.

10. A memory structure comprising:
a semiconductor substrate comprising transistors;
a first word line comprising a first top gate electrode and a first bottom gate electrode that are electrically connected and disposed on the semiconductor substrate;
a second word line comprising a second top gate electrode and a second bottom gate electrode that are electrically connected and disposed on the semiconductor substrate;
a high-k dielectric layer disposed on the semiconductor substrate, the first word line, and the second word line;
a channel layer disposed on the high-k dielectric layer and comprising an oxide semiconductor thin film transistor material a first channel region overlapping with the first word line, a second channel region overlapping with the second word line, and a drain region disposed between the first channel region and the second channel region, wherein the first channel region, the second channel region first, and the drain region directly contact the high-k dielectric layer;
a first source electrode and a second source electrode electrically contacting the channel layer;
a first drain electrode disposed between the first source electrode and the second source electrode and electrically contacting the drain region of the channel layer;
a memory cell comprising a top electrode and a bottom electrode, wherein a bottom surface of the bottom electrode directly contacts a top surface of the first drain electrode and is coplanar with top surfaces of the first top gate electrode and the second top gate electrode; and
a bit line electrically connected to the top electrode of the memory cell,
wherein the top surface of the first drain electrode is larger than the bottom surface of the bottom electrode,
wherein the first word line, the first source electrode, the first drain electrode, and the first channel region form a first thin film transistor (TFT), and the second word line, the second source electrode, the first drain electrode, and the second channel region form a second TFT, and
wherein the first TFT and the second TFT are respectively configured to selectively control current flow from the first source electrode and the second source electrode to the memory cell, such that current is simultaneously provided from both the first TFT and the second TFT to the memory cell when selecting the memory cell.

11. The memory structure of claim 10, wherein the drain region is disposed between the first channel region and the second channel region.

12. The memory structure of claim 10, wherein the drain region is configured to receive current from both the first channel region and the second channel region.

13. The memory structure of claim 10, further comprising a high-k dielectric layer configured to electrically insulate the first top gate electrode and the second top gate electrode from the channel layer, the first source electrode, the second source electrode, and the first drain electrode.

14. The memory structure of claim 10, further comprising:
a source line electrically connected to the first source electrode; and
a source line electrically connected to the second source electrode.

15. The memory structure of claim 10, wherein the memory cell comprises:
a heater and a phase change layer disposed between the top electrode and the bottom electrode; or
a synthetic antiferromagnetic layer disposed between the top electrode and the bottom electrode.

16. A method of forming a memory structure, comprising:
forming a first bottom gate electrode of a first word line and a second bottom gate electrode of a second word line on a semiconductor substrate comprising transistors;
depositing a high-k layer on the semiconductor substrate, the first bottom gate electrode, and the second bottom gate electrode;
depositing an oxide semiconductor thin film transistor material on the high-k layer to form a channel layer comprising a drain region that directly contacts the high-k layer;
forming a first source electrode and a second source electrode that respectively electrically contact a first source region and a second source region of the channel layer;
forming a first drain electrode that electrically contacts the drain region of the channel layer that is disposed between the first source region and the second source region;
forming a first top gate electrode of the first word line and a second top gate electrode of the second word line that respectively overlap with the first bottom gate electrode and the second bottom gate electrode and a first channel region and a second channel region of the channel layer; and
depositing a memory stack comprising a bottom electrode layer that is disposed directly on the first drain electrode, memory material layers disposed on the bottom electrode layer, and a top electrode layer disposed on the memory layers;
patterning the memory stack to form a memory cell comprising a top electrode and a bottom electrode, wherein a bottom surface of the bottom electrode directly contacts a top surface of the first drain electrode and is coplanar with top surfaces of the first top gate electrode and the second top gate electrode; and
forming a bit line that is electrically connected to the top electrode of the memory cell,
wherein the top surface of the first drain electrode is larger than the bottom surface of the bottom electrode,
wherein the first word line, the first source electrode, the first drain electrode, and a first portion of the channel layer form a first thin film transistor (TFT), and the second word line, the second source electrode, the first drain electrode, and a second portion of the channel layer form a second TFT, and
wherein the first TFT and the second TFT are respectively configured to selectively control current flow from the first source electrode and the second source electrode to the memory cell, such that current is simultaneously provided from both the first TFT and the second TFT to the memory cell when selecting the memory cell.

\* \* \* \* \*